United States Patent
So

(10) Patent No.: US 7,381,990 B2
(45) Date of Patent: Jun. 3, 2008

(54) THIN FILM TRANSISTOR WITH MULTIPLE GATES FABRICATED USING SUPER GRAIN SILICON CRYSTALLIZATION

(75) Inventor: Woo-Young So, Suwon-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 158 days.

(21) Appl. No.: 11/023,640

(22) Filed: Dec. 29, 2004

(65) Prior Publication Data

US 2005/0158920 A1    Jul. 21, 2005

Related U.S. Application Data

(60) Continuation-in-part of application No. 10/890,999, filed on Jul. 15, 2004, now Pat. No. 7,001,802, which is a division of application No. 10/298,559, filed on Nov. 19, 2002, now Pat. No. 6,815,267.

(30) Foreign Application Priority Data

Dec. 19, 2001    (KR) ............................... 2001-81446

(51) Int. Cl.
*H01L 27/108* (2006.01)
(52) U.S. Cl. .................. 257/69; 438/149; 438/150; 438/151; 257/E51.005; 257/E29.151; 257/192
(58) Field of Classification Search ............... 438/149, 438/150, 151, 166, 168; 257/E51.005, E29.151, 257/69, 192
See application file for complete search history.

(56) References Cited

U.S. PATENT DOCUMENTS

| | | | |
|---|---|---|---|
| 5,403,772 A | 4/1995 | Zhang et al. ............... 437/101 |
| 5,488,000 A | 1/1996 | Zhang et al. | |
| 5,534,716 A | 7/1996 | Takemura | |
| 5,604,360 A | 2/1997 | Zhang et al. | |
| 5,656,575 A * | 8/1997 | Mueller ....................... 505/190 |
| 5,773,327 A * | 6/1998 | Yamazaki et al. .......... 438/154 |
| 5,895,935 A | 4/1999 | Yamazaki et al. | |
| 6,027,987 A | 2/2000 | Yamazaki et al. | |
| 6,028,635 A | 2/2000 | Owen et al. | |
| 6,031,328 A | 2/2000 | Nakamoto | |

(Continued)

FOREIGN PATENT DOCUMENTS

CN    1198596 A    11/1998

(Continued)

OTHER PUBLICATIONS

European Search Report, dated Oct. 26, 2004.

(Continued)

*Primary Examiner*—Thao P. Le
(74) *Attorney, Agent, or Firm*—Stein, McEwen & Bui, LLP

(57) ABSTRACT

A thin film transistor with multiple gates is fabricated using a super grain silicon (SGS) crystallization process. The thin film transistor a semiconductor layer formed in a zigzag shape on an insulating substrate, and a gate electrode intersecting with the semiconductor layer. The semiconductor layer has a high-angle grain boundary in a portion of the semiconductor layer that does not cross the gate electrode.

24 Claims, 20 Drawing Sheets

U.S. PATENT DOCUMENTS

| | | |
|---|---|---|
| 6,034,748 A | 3/2000 | Furuta |
| 6,103,558 A * | 8/2000 | Yamanaka et al. .......... 438/166 |
| 6,184,559 B1 | 2/2001 | Hayakawa et al. |
| 6,207,481 B1 | 3/2001 | Yi et al. |
| 6,232,140 B1 | 5/2001 | Ferrari et al. |
| 6,399,959 B1 | 6/2002 | Chang et al. |
| 6,475,835 B1 * | 11/2002 | Hu et al. .................... 438/147 |
| 6,482,686 B1 | 11/2002 | Takemura |
| 6,596,572 B1 | 7/2003 | Kobori et al. |
| 6,596,573 B2 | 7/2003 | Lee et al. |
| 6,614,054 B1 | 9/2003 | Ahn |
| 6,703,289 B2 | 3/2004 | Muramatsu et al. |
| 6,706,573 B2 | 3/2004 | So |
| 6,815,267 B2 | 11/2004 | So |
| 6,861,300 B2 | 3/2005 | Ahn |
| 6,875,628 B1 | 4/2005 | Zhang et al. |
| 6,903,370 B2 * | 6/2005 | Voutsas et al. ............... 257/59 |
| 6,933,526 B2 | 8/2005 | So |
| 7,001,802 B2 | 2/2006 | So |
| 7,112,475 B2 | 9/2006 | So |
| 2001/0000011 A1 | 3/2001 | Zhang et al. |
| 2001/0000627 A1 | 5/2001 | Hayakawa et al. ......... 257/347 |
| 2001/0018240 A1 | 8/2001 | Joo et al. .................... 438/166 |
| 2001/0034088 A1 | 10/2001 | Nakamura et al. .......... 438/166 |
| 2001/0045559 A1 | 11/2001 | Yamazaki et al. ............. 257/66 |
| 2002/0074548 A1 | 6/2002 | Lee et al. |
| 2002/0137267 A1 | 9/2002 | Joo et al. |
| 2002/0146869 A1 | 10/2002 | So ............................. 438/149 |
| 2003/0111691 A1 | 6/2003 | So |
| 2006/0003503 A1 * | 1/2006 | Yang et al. ................. 438/151 |
| 2006/0006465 A1 | 1/2006 | Park et al. |
| 2006/0046357 A1 | 3/2006 | Lee et al. |

FOREIGN PATENT DOCUMENTS

| | | |
|---|---|---|
| CN | 1053292 C | 6/2000 |
| EP | 1 052 700 A1 | 11/2000 |
| EP | 1 054 452 A2 | 11/2000 |
| JP | 6-244205 | 9/1994 |
| JP | 7-38118 | 2/1995 |
| JP | 7-153689 | 6/1995 |
| JP | 8-330595 | 12/1996 |
| JP | 9-293879 | 11/1997 |
| JP | 10-135137 | 5/1998 |
| JP | 10-154816 | 6/1998 |
| JP | 10-284734 | 10/1998 |
| JP | 2001-007335 | 1/2001 |
| JP | 2001-144027 | 5/2001 |

OTHER PUBLICATIONS

U.S. Appl. No. 10/978,376, filed Nov. 2, 2004, So, Samsung SDI Co., Ltd.

U.S. Appl. No. 11/010,271, filed Dec. 14, 2004, So, Samsung SDI Co., Ltd.

U.S. Appl. No. 11/011,584, filed Dec. 15, 2004, So, Samsung SDI Co., Ltd.

U.S. Appl. No. 11/023,637, filed Dec. 29, 2004, So, Samsung SDI Co., Ltd.

U.S. Appl. No. 11/105,382, filed Apr. 14, 2005, So, Samsung SDI Co., Ltd.

* cited by examiner

THIN FILM TRANSISTOR WITH MULTIPLE GATES FABRICATED USING SUPER GRAIN SILICON CRYSTALLIZATION

CROSS-REFERENCE TO RELATED APPLICATIONS

This application is a continuation-in-part of application Ser. No. 10/890,999 filed on Jul. 15, 2004, now U.S. Pat. No. 7,001,802, which is a division of application Ser. No. 10/298,559 filed on Nov. 19, 2002, now U.S. Pat. No. 6,815,267. This application also claims the benefit of Korean Application No. 2001-81446 filed on Dec. 19, 2001, in the Korean Intellectual Property Office, the disclosure of which is incorporated herein by reference.

BACKGROUND OF THE INVENTION

1. Field of the Invention

The present invention relates to a thin film transistor using super grain silicon crystallization (hereinafter referred to as "SGS"), and more particularly, to a TFT with multiple gates which prevents defects by removing a high-angle grain boundary in a channel region and reduces leakage current by materializing multiple gates without increasing the area.

2. Description of Related Art

A polysilicon film which is used as a semiconductor layer of a TFT is formed by crystallizing the deposited amorphous silicon film after depositing an amorphous silicon film on a substrate. Methods of crystallizing the amorphous silicon film into a polysilicon film include solid phase crystallization (SPC), excimer laser annealing (ELA), metal induced lateral crystallization (MILC), etc. The SPC process has problems of a high crystallization temperature and a long period of process time while the ELA process has problems of time and space non-uniformities due to instability of a laser. Although the MILC process has merits of a relatively low process temperature and short process time using ordinary heat treatment equipment, it has problems in that a leakage current of a device fabricated by the MILC process is larger than that of a device fabricated by other crystallization methods.

A method of fabricating a TFT using the MILC process is disclosed in U.S. Pat. No. 5,773,327. The method of fabricating a TFT suggested in U.S. Pat. No. 5,773,327 requires an additional mask process to form an MILC region, and the existence of MILC surfaces in the channel region act as defects of the TFT. The MILC surface refers to a portion in which two surfaces of crystallized polysilicon grown in an opposite direction by the MILC technique meet.

On the other hand, there are problems in that a crystallization time is increased since dimensions by multiple gates are increased, and dimensions separated between metal layers of the MILC are increased in the case that multiple gates are applied to control leakage current.

SUMMARY OF THE INVENTION

Accordingly, it is an object of the present invention to provide a TFT which is capable of realizing multiple gates without increasing dimensions thereof, and a method of fabricating the same.

It is another object of the present invention to provide a TFT with multiple gates which are capable of reducing leakage current, and a method of fabricating the same.

It is another object of the present invention to provide a TFT with multiple gates using each of separated multi-channel layers, and a method of fabricating the same.

It is another object of the present invention to provide a TFT with multiple gates using a SGS process in which a high angle-grain boundary exists outside a channel layer, and a method of fabricating the same.

It is another object of the present invention to provide a method of fabricating a TFT with multiple gates using a SGS process which is capable of reducing the masking process.

Additional objects and advantages of the invention will be set forth in part in the description which follows and, in part, will be obvious from the description, or may be learned by practice of the invention.

The foregoing and other objects of the present invention may be achieved by providing a thin film transistor using super grain silicon (SGS) crystallization comprising: a semiconductor layer formed on an insulating substrate in a zigzag shape; and a gate electrode formed so that it intersects with the semiconductor layer, wherein the semiconductor layer has a high-angle grain boundary at a part which does not cross the gate electrode.

The semiconductor layer comprises: two or more body parts intersecting with the gate electrode; and one or more connection parts to connect each neighboring body part, and wherein a part intersecting with the gate electrode in the semiconductor layer acts as a channel region.

The gate electrode is equipped with one or more slots intersecting the semiconductor layer, wherein a part overlapped with the channel region of the semiconductor layer acts as a multiple gate.

The foregoing and other objects of the present invention may also be achieved by providing a thin film transistor, comprising: multi-semiconductor layers each of which are adjacently formed on an insulating substrate; and a gate electrode which is formed so that it intersects with the semiconductor layer, wherein a high-angle grain boundary does not exist in the multi-semiconductor layers.

The foregoing and other objects of the present invention may also be achieved by providing a thin film transistor, comprising: multi-semiconductor layers each of which are adjacently formed on an insulating substrate; and a gate electrode which is formed so that it intersects with the semiconductor layer, thereby forming different channel regions, wherein a high-angle grain boundary does not exist in the channel regions.

The foregoing and other objects of the present invention may also be achieved by providing a thin film transistor comprising: a semiconductor layer formed in a rectangular shape having one side open or formed in a zigzag shape on an insulating substrate; and a gate electrode having at least one slot crossing the semiconductor layer; wherein the semiconductor layer has a high-angle grain boundary at a part corresponding to the slot of the gate electrode; wherein the semiconductor layer comprises: two or more body parts intersecting with the gate electrode, and one or more connection parts to connect the neighboring body parts, wherein channel regions are formed where the body parts intersect with the gate electrode; and wherein multiple gates are formed on the gate electrode, corresponding to the channel regions formed on the semiconductor layer.

BRIEF DESCRIPTION OF THE DRAWINGS

These and other objects and advantages of the invention will become apparent and more readily appreciated from the following description of the embodiments, taken in conjunction with the accompanying drawings of which.

DETAILED DESCRIPTION OF THE INVENTION

Figure 1A:
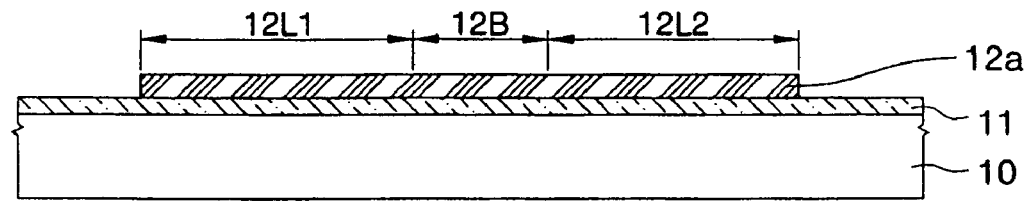
FIG. 1A to FIG. 1D are sectional views illustrating a method of fabricating a multi-gate TFT using a SGS process according to an embodiment of the present invention.

Reference will now be made in detail to the embodiments of the present invention, examples of which are illustrated in the accompanying drawings, wherein like reference numerals refer to like elements throughout. The embodiments are described below in order to explain the present invention by referring to the figures.

Figure 1B:
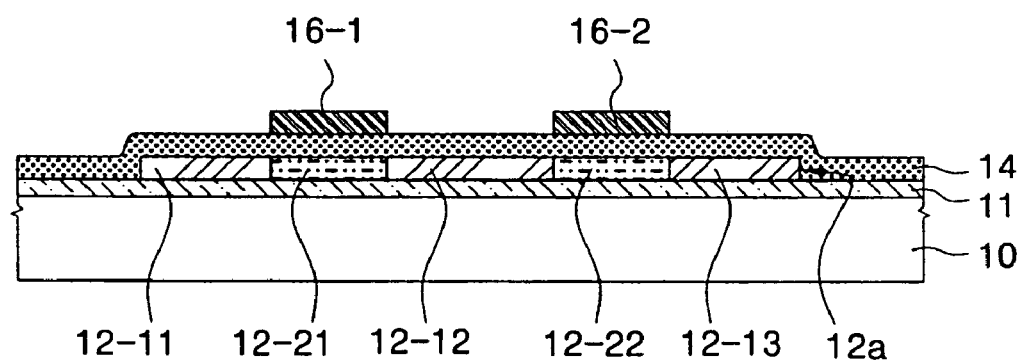
Figure 1C:
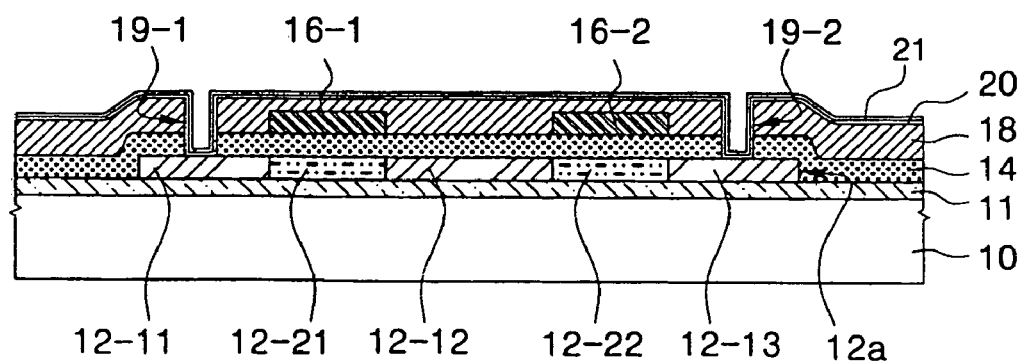
Figure 1C:
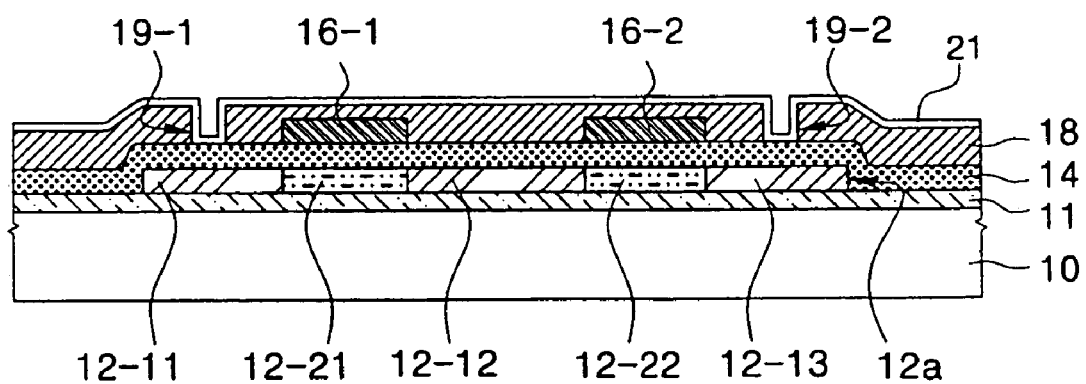
Figure 1D:
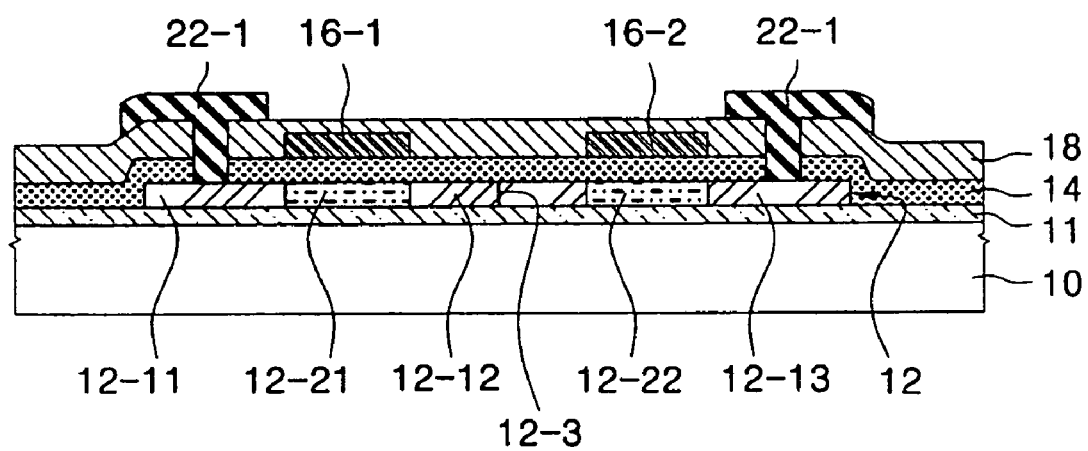
Figure 2A:
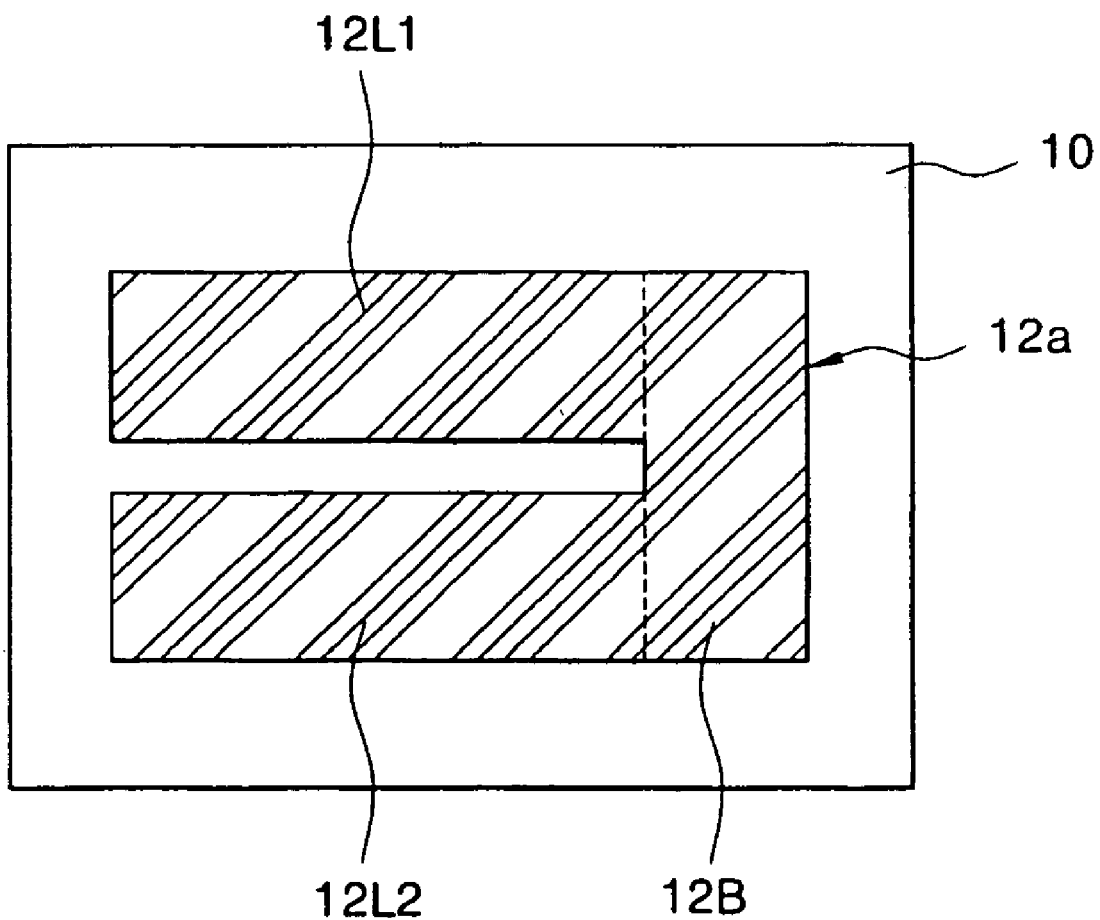
FIG. 2A to FIG. 2D are plan views illustrating a method of fabricating a multi-gate TFT using the SGS process according to the embodiment of FIGS. 1A to 1D.
Figure 2B:
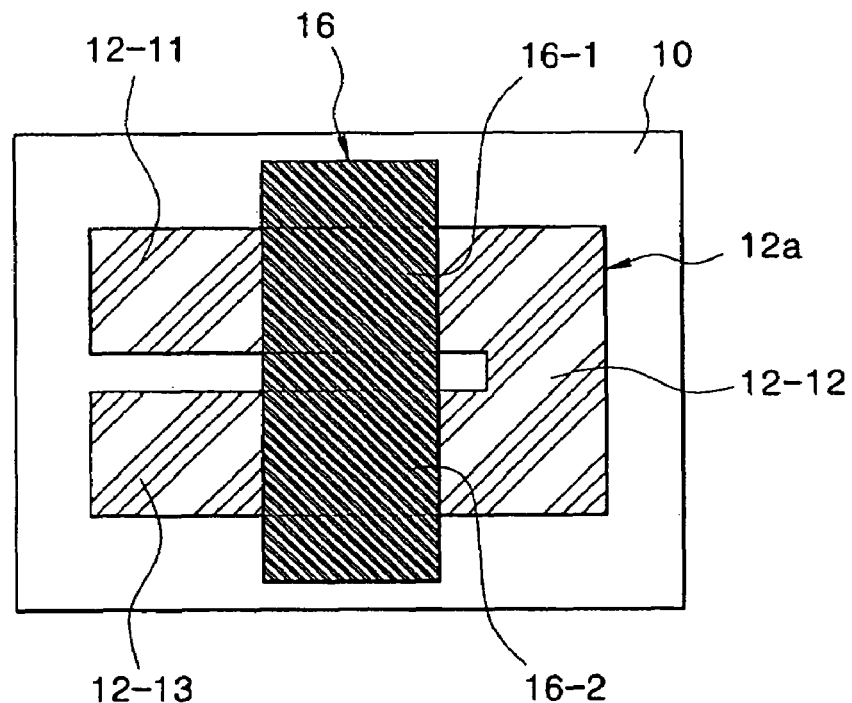
Figure 2C:
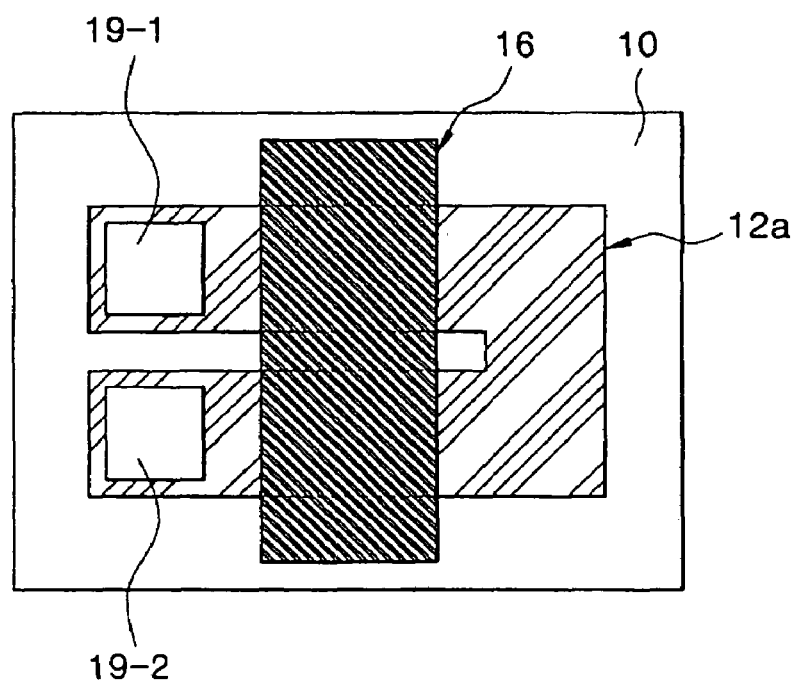
Figure 2D:
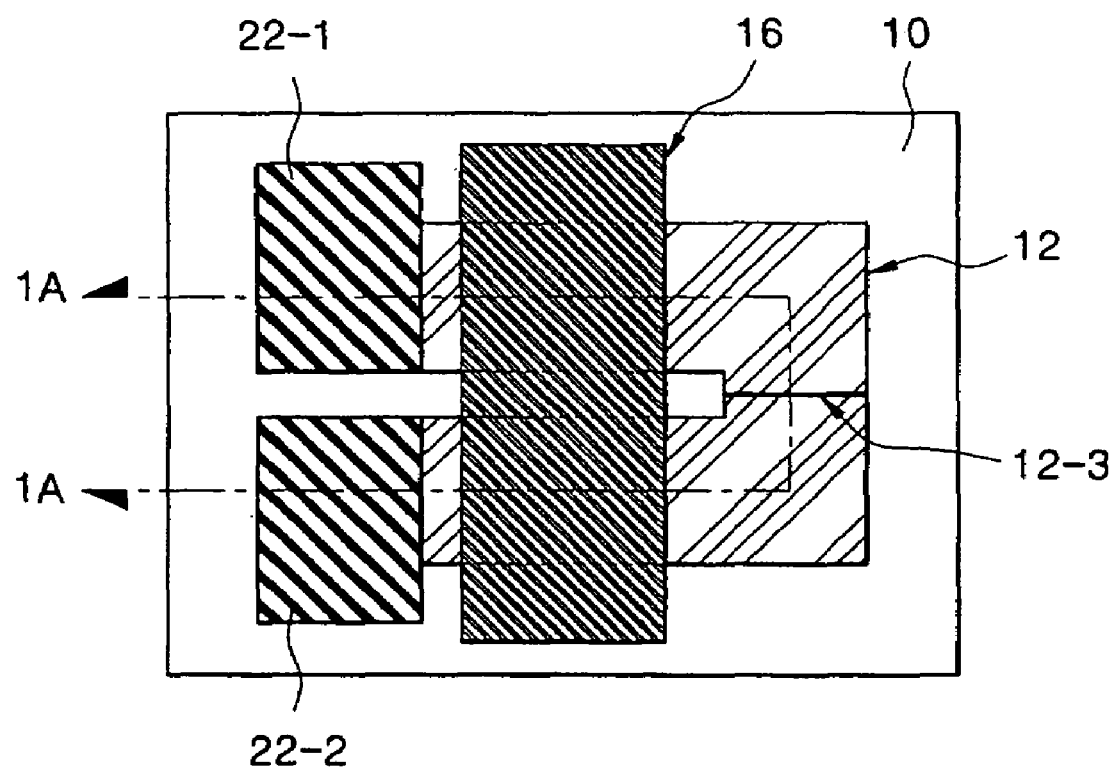

FIG. 1A to FIG. 1D are sectional views illustrating a method of fabricating a multi-gate TFT using a SGS process according to an embodiment of the present invention, and FIG. 2A to FIG. 2D are plan views illustrating a method of fabricating a multi-gate TFT using the SGS process according to the embodiment of FIG. 1A to FIG. 1D, wherein FIG. 1A to FIG. 1D are the cross-sectional structures illustrating a fabrication method according to a line 1A-1A' of FIG. 2D.

Referring to FIG. 1A and FIG. 2A, a buffer layer 11 is formed on a insulating substrate 10 such as a glass substrate, and an amorphous silicon film is patterned using a first mask (which is not shown in the drawings) after depositing an amorphous silicon film on the buffer layer 11 so that a semiconductor layer 12a having an amorphous silicon film is formed, wherein the semiconductor layer 12a comprising an amorphous silicon film has a "⊏" shaped structure equipped with body parts 12L1 and 12L2 and a connection part 12B connecting the body parts 12L1 and 12L2.

Figure 10:
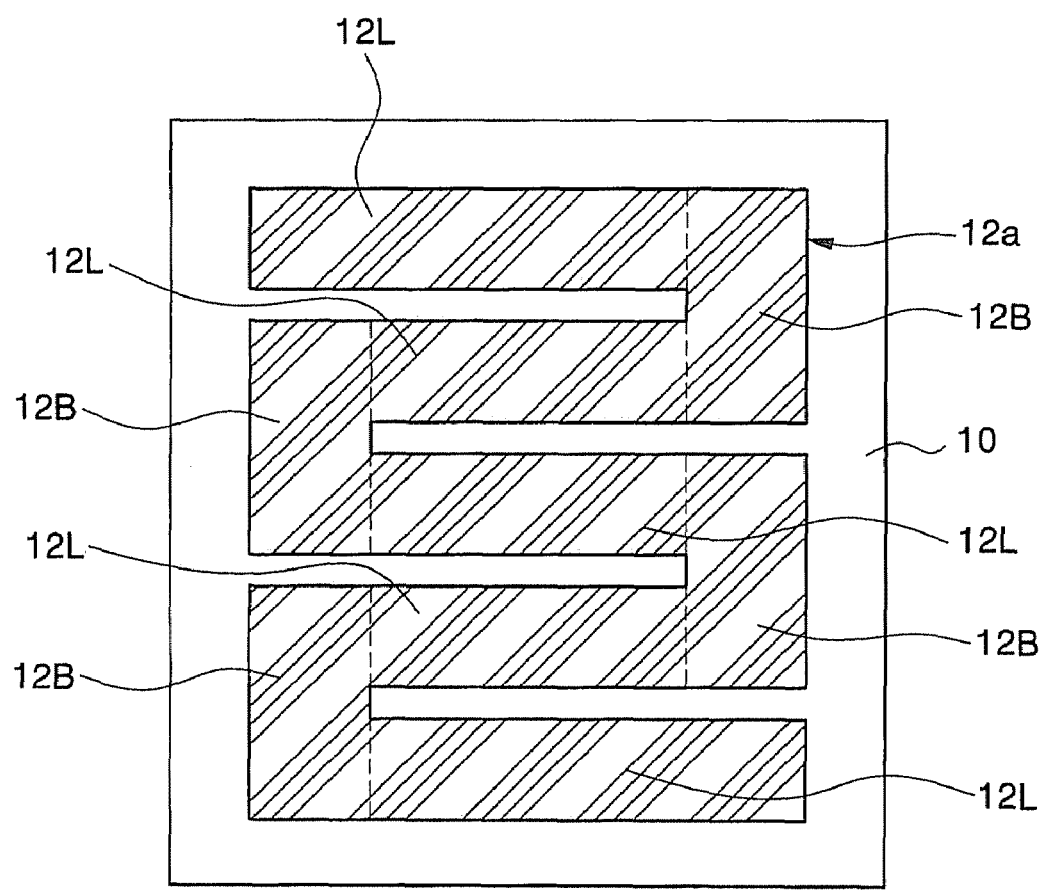
FIG. 10 is a plan view illustrating a semiconductor layer having a zigzag shape.

Although several embodiments of the present invention exemplify that the semiconductor layer 12a has a "⊏" shaped structure equipped with a pair of body parts 12L1 and 12L2 and a connection part 12B connecting the body parts 12L1 and 12L2 as shown in FIG. 2A, the semiconductor layer 12a is not necessarily limited to such a structure, but can have a "E" or "ᄏ" shaped structure, or a combination thereof equipped with a plurality of body parts 12L, wherein the plurality of body parts 12L are connected by a plurality of connection parts 12B so that the semiconductor layer 12a has a zigzag shaped structure as shown, for example, in FIG. 10.

Referring to FIG. 1B and FIG. 2B, a gate electrode material is deposited on the gate insulating film 14 after forming a gate insulating film 14 on a buffer layer 11 comprising the semiconductor layer 12a. A gate electrode 16 is formed by patterning the gate electrode material using a second mask (which is not shown on the drawings).

The gate electrode 16 is formed so that it intersects with the body parts 12L1 and 12L2 of the semiconductor layer 12a, wherein a part 16-1 of the gate electrode 16 overlapping a first body part 12L1 acts as a first gate while a part 16-2 overlapping a second body 12L2 acts as a second gate, thereby obtaining a multi-gate.

On the other hand, the gate electrode 16 may have parts acting as more than two gates since parts of the gate electrode 16 overlapping the body parts 12L would each act as a gate where the semiconductor layer 12a is not formed in a "⊏" shape as shown in FIG. 2A, but is formed in a zigzag shape equipped with a plurality of body parts 12L as shown, for example, in FIG. 10. The example shown in FIG. 10 has five body parts 12L, such that the gate electrode 16 would have five parts overlapping the five body parts 12L and acting as five gates.

Impurity areas 12-11~12-13 for source/drain regions are formed by ion-implanting impurities, for example, N-type or P-type impurities into the semiconductor layer 12a comprising an amorphous silicon film after forming the gate electrode 16.

A part of the lower part of the first gate 16-1 in the semiconductor layer 12a comprises an amorphous silicon film, namely, a part between impurity areas 12-11 and 12-12 for source/drain regions acts as a first channel region 12-21, and a part of the lower part of the second gate 16-2, namely, a part between impurity areas 12-12 and 12-13 for the source/drain regions acts as a second channel region 12-22.

Referring to FIG. 1C, FIG. 1C' and FIG. 2C, an interlayer insulating film 18 is formed on the gate insulating film 14 comprising the gate electrode 16, and contact holes 19-1 and 19-2 are respectively formed in impurity areas 12-11 and 12-13 for the source/drain regions by etching the interlayer insulating film 18 and the gate insulating film 14 using a third mask (which is not shown in the drawings). The contact holes 19-1 and 19-2 are formed at edge parts of both sides of the semiconductor layer 12a formed in a "⊏" shape so that the contact holes 19-1 and 19-2 are formed at one side edge of the body part arranged at the outermost wall part in a plurality of body parts 12L1 and 12L2, that is, one side edge of the body part that is not connected by a connection part 12B.

Subsequently, referring to FIG. 1C, a capping layer 20 and a metal film 21 each having a thickness of several angstroms Å to hundreds of angstroms Å are formed on the interlayer insulating film 18 and portions of the impurity areas 12-11 and 12-13 in the semiconductor layer 12a comprising the amorphous silicon film that are exposed by the contact holes 19-1 and 19-2. The capping layer 20 is formed so that the capping layer 20 directly contacts the exposed portions of impurity areas 12-11 and 12-13 in the semiconductor layer 12a comprising the amorphous silicon film through the contact holes 19-1 and 19-2. The capping layer 20 controls a concentration of metal diffused from the metal film 21 into the impurity areas 12-11 and 12-13 in the semiconductor layer 12a comprising the amorphous silicon film. The capping layer 20 is made of SiO2 or SiNx, and is preferably made of SiO2. The metal film 21 is made of a metal such as Ni or Pd. Metal from the metal film 21 is diffused into the impurity areas 12-11 and 12-13 in the semiconductor layer 12a comprising the amorphous silicon film to form crystallization seeds in the impurity areas 12-11 and 12-13 in the semiconductor layer 12a comprising the amorphous silicon film.

On the other hand, referring to FIG. 1C', instead of forming the capping layer 20, the gate insulating film 14 remains in the source/drain regions. The remaining gate insulating film 14 in the source/drain regions acts as a capping layer when the SGS process proceeds.

Referring to FIG. 1D and FIG. 2D, a semiconductor layer 12 comprises a polycrystalline silicon film formed by crystallizing the semiconductor layer 12a comprising an amorphous silicon film using an SGS process, wherein a high-angle grain boundary 12-3 does not exist in first and second channel regions 12-21 and 12-22 of the semiconductor layer 12, but exists in an impurity area 12-12 for the source/drain regions. A high-angle grain boundary is a boundary where grown grains meet, thereby forming a grain boundary.

And then, in the case of the configuration in FIG. 1C, the capping layer 20 and the metal film 21 are removed, or in the case of the configuration in FIG. 1C', the metal film 21 and the portions of the gate insulating film 14 in the contact holes 19-2 and 19-2 are removed.

Subsequently, source/drain electrodes 22-1 and 22-2 are formed by patterning a metal layer for forming the source/drain electrodes 22-1 and 22-2 using a fourth mask (which is not shown in the drawings) after depositing the metal layer for forming the source/drain electrodes 22-1 and 22-2.

Figure 3A:
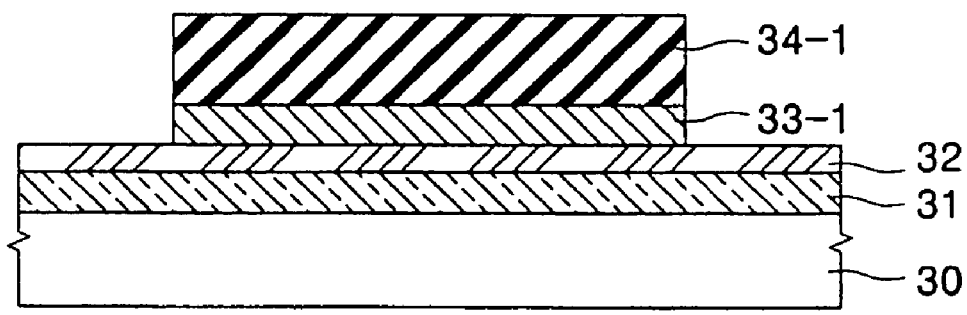
FIG. 3A to FIG. 3F are sectional views illustrating a method of fabricating a multi-gate TFT using a SGS process according to another embodiment of the present invention.
Figure 3B:
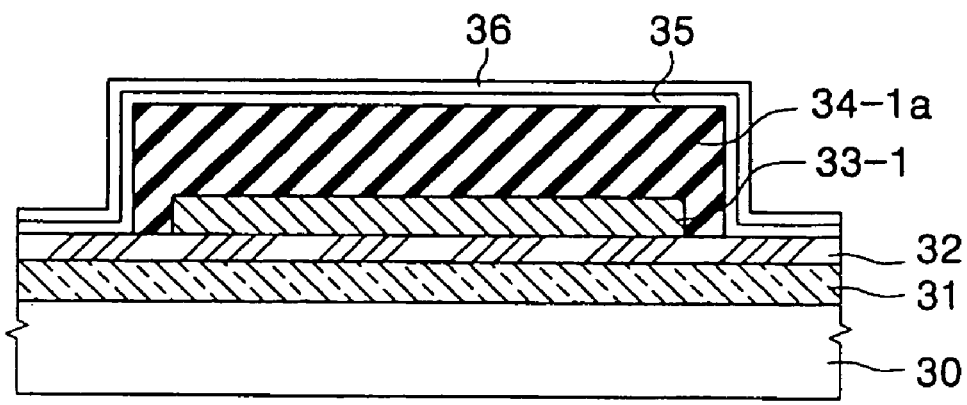
Figure 3C:
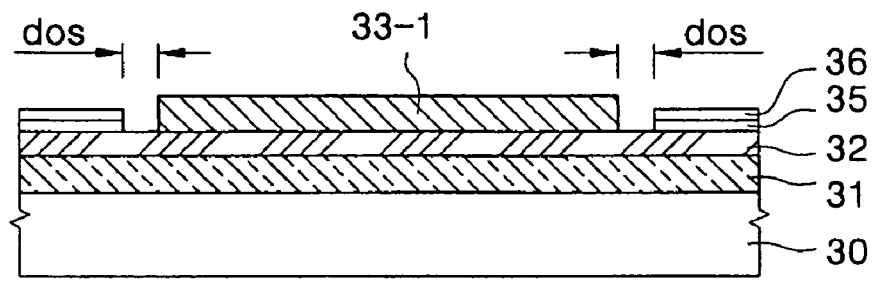
Figure 3D:
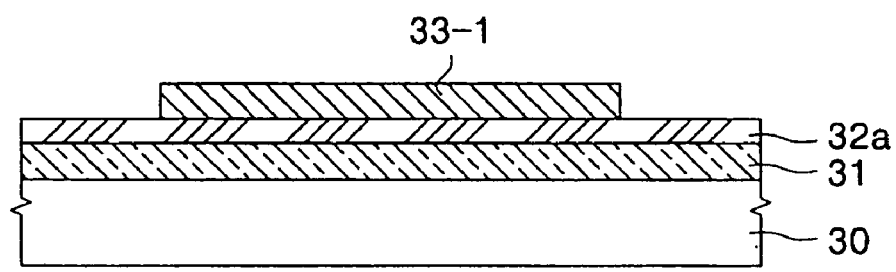
Figure 3E:
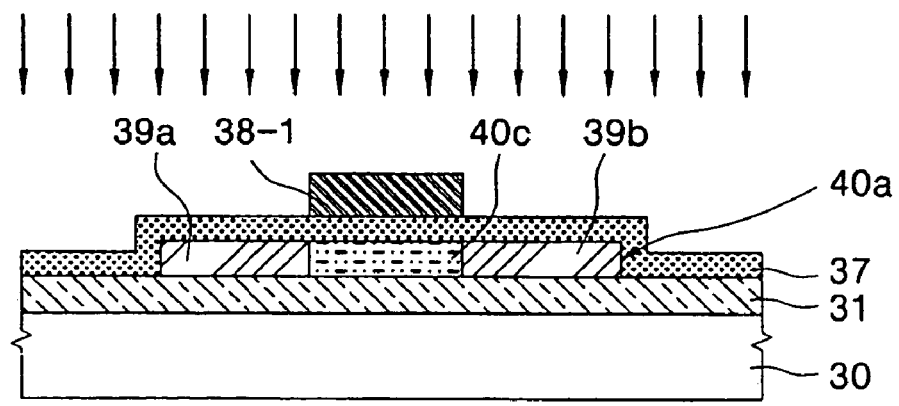
Figure 3F:
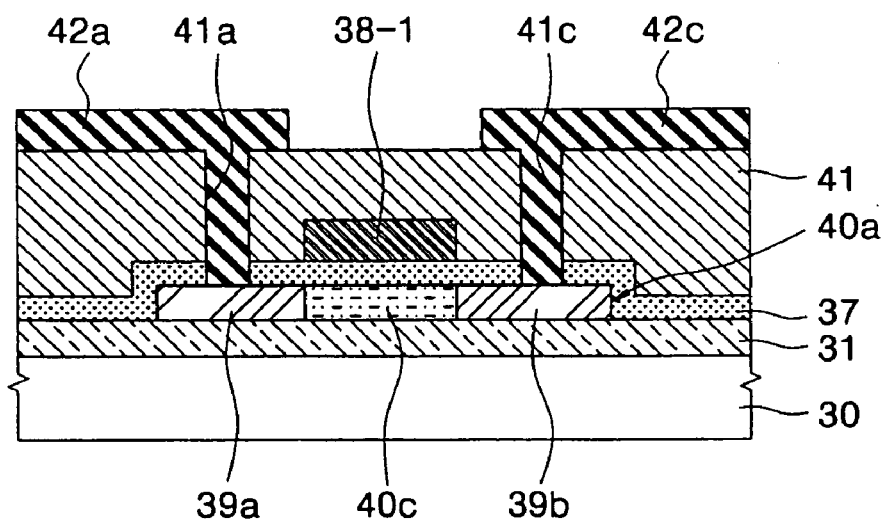
Figure 4A:
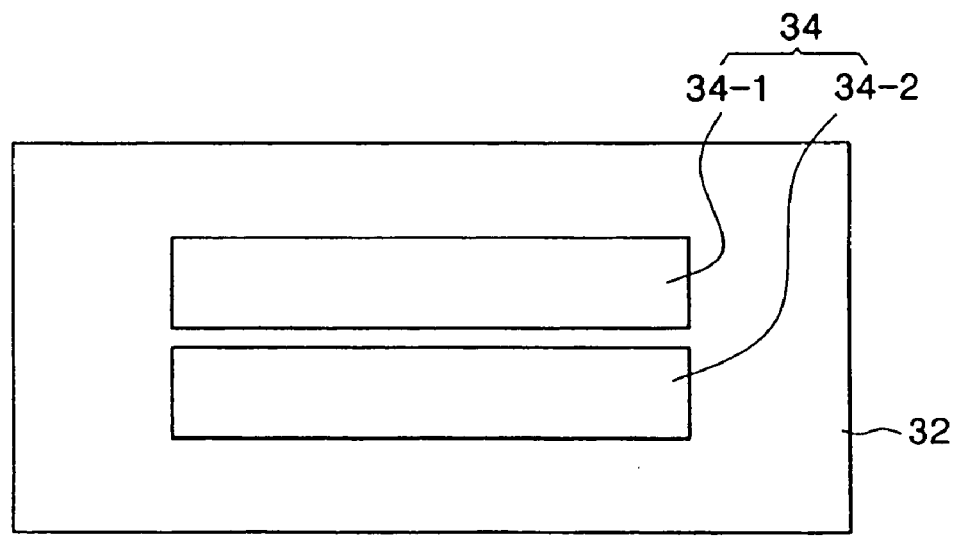
FIG. 4A to FIG. 4F are plan views illustrating a method of fabricating a multi-gate TFT using the SGS process according the embodiment of FIGS. 3A to 3D.
Figure 4B:
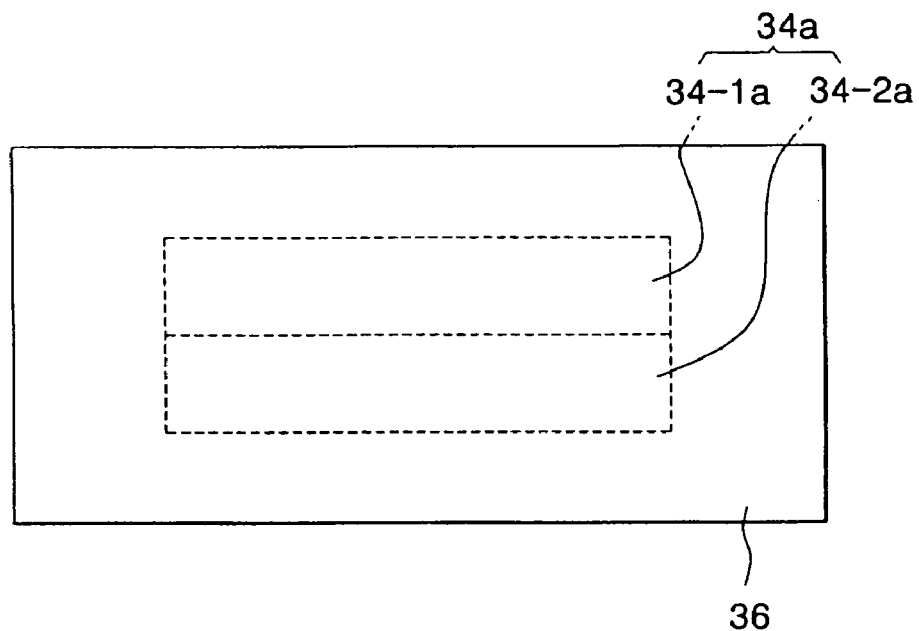
Figure 4C:
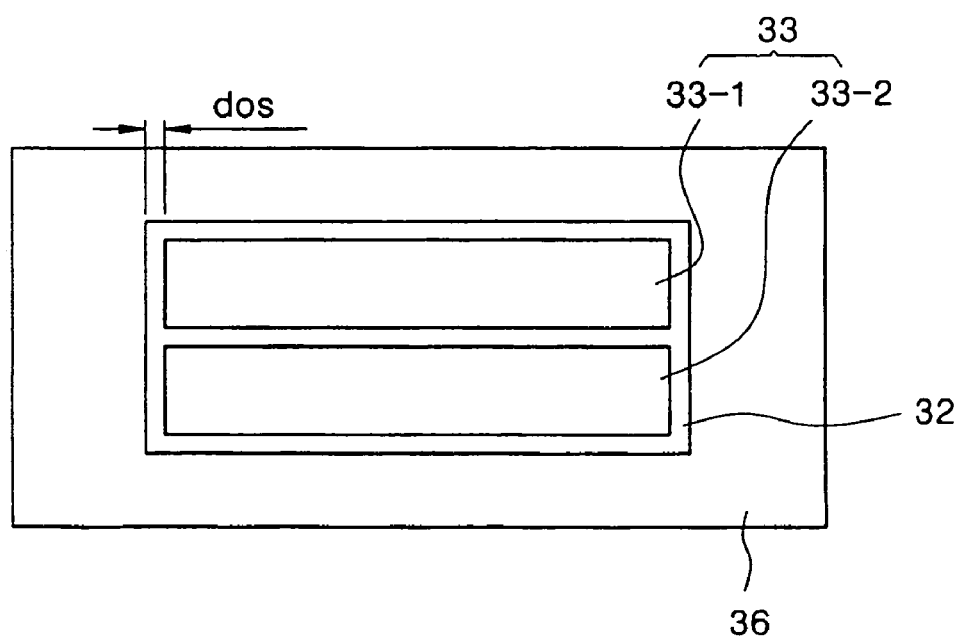
Figure 4D:
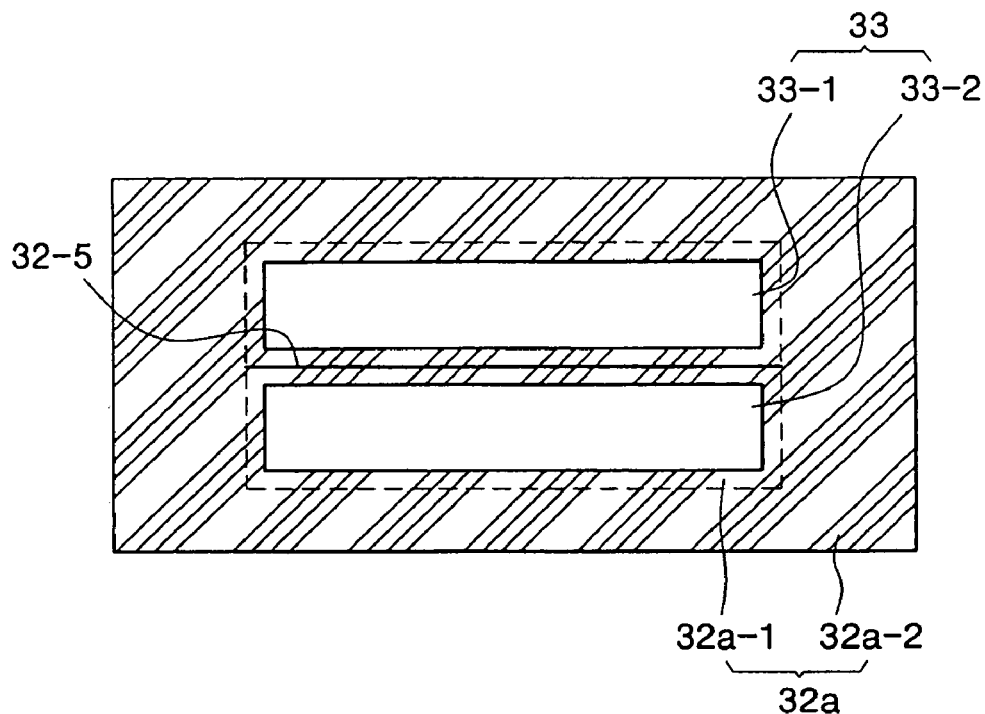
Figure 4E:
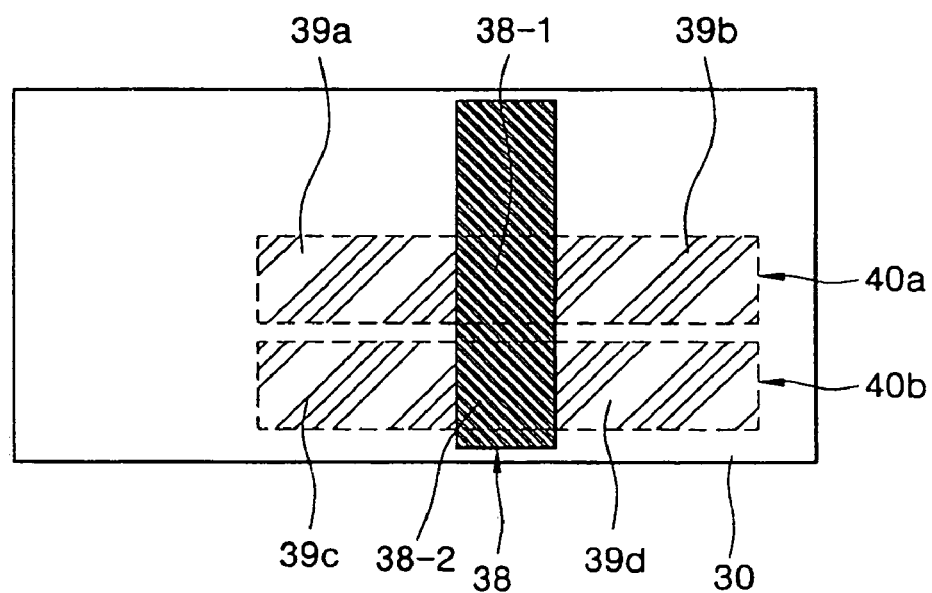
Figure 4F:
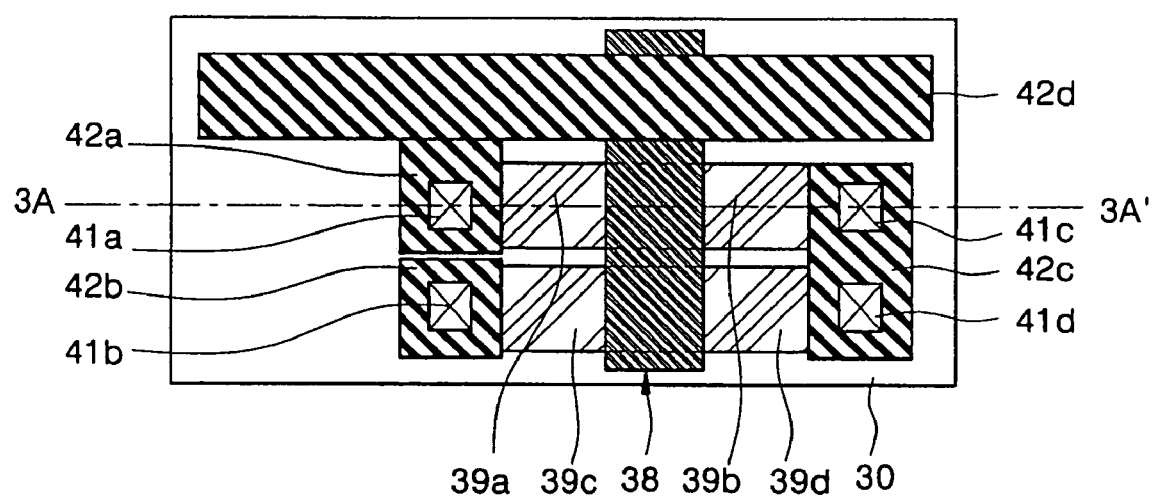

FIG. 3A to FIG. 3F illustrate process sectional views illustrating a method of fabricating a multiple gate TFT with a multi-semiconductor layer using an SGS process according to another embodiment of the present invention, and FIG. 4A to FIG. 4F illustrate plan views illustrating a method of fabricating a multiple gate TFT with a multi-semiconductor layer using the SGS process according to the embodiment of FIG. 3A to FIG. 3F, wherein FIG. 3A to FIG. 3F illustrate the cross-sectional structure according to a line 3A-3A' of FIG. 4F limited to a first semiconductor layer in the multi-semiconductor layer, and a second semiconductor layer has the same structure as the first semiconductor layer.

Referring to FIG. 3A and FIG. 4A, a buffer layer 31 comprising an oxidation film is formed on an insulating substrate 30 such as a glass substrate, and an amorphous silicon film 32 and an oxidation film as a blocking layer 33 are subsequently formed on a buffer layer 31.

A photosensitive film 34 having the same pattern as a mask to form a multi-semiconductor layer formed in the subsequent process is formed on the blocking layer 33 using a first mask (which is not shown on the drawings), wherein the photosensitive film 34 has a first pattern 34-1 for a first semiconductor layer and a second pattern 34-2 for a second semiconductor layer which are spaced apart from each other by a predetermined distance.

A first pattern 33-1 functioning as a blocking layer for the first semiconductor layer and a second pattern 33-2 functioning as a blocking layer for the second semiconductor layer are formed by patterning the blocking layer 33 at the lower part of the photosensitive film 34 using the photosensitive film 34.

Referring to FIG. 3B and FIG. 4B, the photosensitive film 34 is then reflowed to form a reflowed photosensitive film 34a that completely covers the patterned blocking layer 33. A first pattern 34-1a and a second pattern 34-2a of the reflowed photosensitive film 34a formed from the first pattern 34-1 and the second pattern 34-2 of the photosensitive film 34 contact each other. The blocking layer 33, a portion of the amorphous silicon film 32 surrounding the block layer 33, and a portion of the amorphous silicon film 32 between the first pattern 33-1 and the second pattern 33-2 of the blocking layer 33 are completely covered by the reflowed photosensitive film 34a.

Subsequently, referring to FIG. 3B and FIG. 4B, a capping layer 35 and a metal film 36 each having a thickness of several angstroms Å to hundreds of angstroms Å are formed on the reflowed photosensitive film 34a and the amorphous silicon film 32. The capping layer 35 controls a concentration of metal diffused from the metal film 36 into the amorphous silicon film 32. The capping layer 35 is made of SiO2 or SiNx, and is preferably made of SiO2. The metal film 36 is made of a metal such as Ni or Pd. Metal from the metal film 36 is diffused into the amorphous silicon film 32 to form crystallization seeds in the amorphous silicon film 32.

Referring to FIG. 3C and FIG. 4C, the reflowed photosensitive film 34a and the portions of the capping layer 35 and the metal film 36 on the reflowed photosensitive film 34a are removed to expose the blocking layer 33, the portion of the amorphous silicon film 32 surrounding the blocking layer 33 that was covered by the reflowed photosensitive film 34a, and the portion of the amorphous silicon film 32 between the first pattern 33-1 and the second pattern 33-2 of the blocking layer 33 The width of the exposed portion of the amorphous silicon film 32 surrounding the blocking layer 33 is dos.

Referring to FIG. 3D and FIG. 4D, a polycrystalline silicon film 32a is formed by crystallizing the amorphous silicon film 32 using the SGS process, and then the remaining portions of the capping layer 35 and the metal film 36 are removed. The polycrystalline silicon film 32a is divided into a part 32a-1 that was crystallized by the SGS process without the crystallization seeds, and a part 32a-2 that was crystallized by the SGS process with the crystallization seeds. A high-angle grain boundary 32-5 formed between the first pattern 33-1 and the second pattern 33-2 of the blocking layer 33 during the SGS process is exposed.

Referring to FIG. 3E and FIG. 4E, a multi-semiconductor layer comprising a first semiconductor layer 40a and a second semiconductor layer 40b each formed only from the part 32a-1 that was crystallized by the SGS process without the crystallization seeds is formed by etching the polycrystalline silicon film 32a under the blocking layer 33 using the first pattern 33-1 and the second pattern 33-2 of the blocking layer 33 as a masks. The exposed high-angle grain boundary 32-5 between the first pattern 33-1 and the second pattern 33-2 of the blocking layer is removed during the etching, and thus does not exist in the first semiconductor layer 40a and the second semiconductor layer 40b formed during the etching.

Subsequently, a gate insulating film 37 is formed on the front surface of a substrate after removing the blocking layer 33, and a gate electrode 38 is formed on the gate insulating film 37 using a second mask (which is not shown in the drawings) to form a gate, wherein a part overlapped by the first semiconductor layer 40a acts as a first gate 38-1, and a part overlapped by the second semiconductor layer 40b acts as a second gate 38-2 in the gate electrode 38.

Each of impurity areas 39a–39d for source/drain regions are formed by ion-implanting high concentrations of impurities of P-type or N-type into the first semiconductor layer 40a and the second semiconductor layer 40b using the gate electrode 38 as a mask, wherein a part overlapped by the first gate 38-1 in the first semiconductor layer 40a acts as a first channel region 40c, while a part overlapped by the second gate 38-2 in the second semiconductor layer 40b acts as a second channel region (not shown).

Referring to FIG. 3F and FIG. 4F, an interlayer insulating film 41 is formed on the front surface of the substrate, and contacts 41a and 41b for the source/drain electrodes 42a and 42b and linking contacts 41c and 41d to connect first and second semiconductor layers 40a and 40b, that is, impurity areas 39b and 39d for source/drain regions are formed by etching the interlayer insulating film 41 and the gate insulating film 37 so that the impurity areas 39a through 39d are exposed using a third mask (which is not shown in the drawings) to form contacts.

Source/drain electrodes 42a and 42b connected with impurity areas 39a and 39c for the source/drain regions through contacts 41a and 41b, a link 42c, and a data line 42d to connect impurity areas 39b and 39d for the source/drain regions through linking contacts 41c and 41d are formed by patterning the deposited electrode material using a fourth mask (which is not shown in the drawings) to form the source/drain electrodes after depositing a source/drain electrode material on the interlayer insulating film 41.

The method of fabricating a thin film transistor according to this embodiment enables fabricating of a multi-gate thin film transistor using the SGS technique without an additional masking process, thereby not only simplifying the processes involved, but also suppressing leaking of current by removing the high-angle grain boundary containing a large amount of metal during the etching process to form a multi-semiconductor layer, thus removing the causes of defects.

Furthermore, although it is illustrated in this embodiment that the gate has an "I" shaped structure, it is also possible that the gate can be formed as a structure having a plurality of slots as described in the following examples. In this case, a thin film transistor not having a multi-gate structure of a multi-semiconductor layer but having a structure of 2×N (slot numbers of the gate electrode+1) multi-channel layers or multiple gates is supplied instead.

Figure 5A:
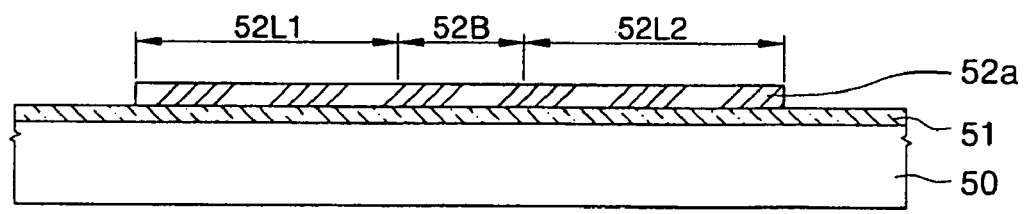
FIG. 5A to FIG. 5D are process sectional views illustrating a method of fabricating a 4-fold gate TFT using the SGS process according to yet another embodiment of the present invention.
Figure 5B:
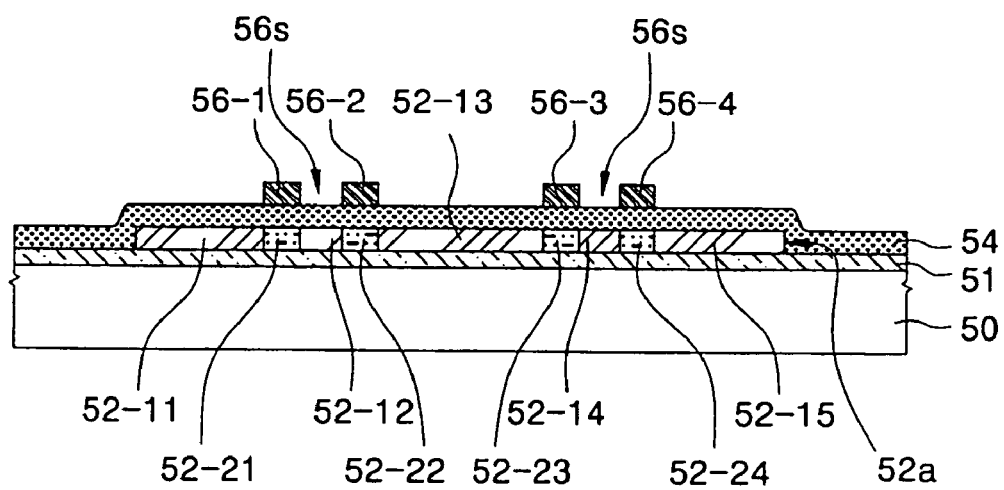
Figure 5C:
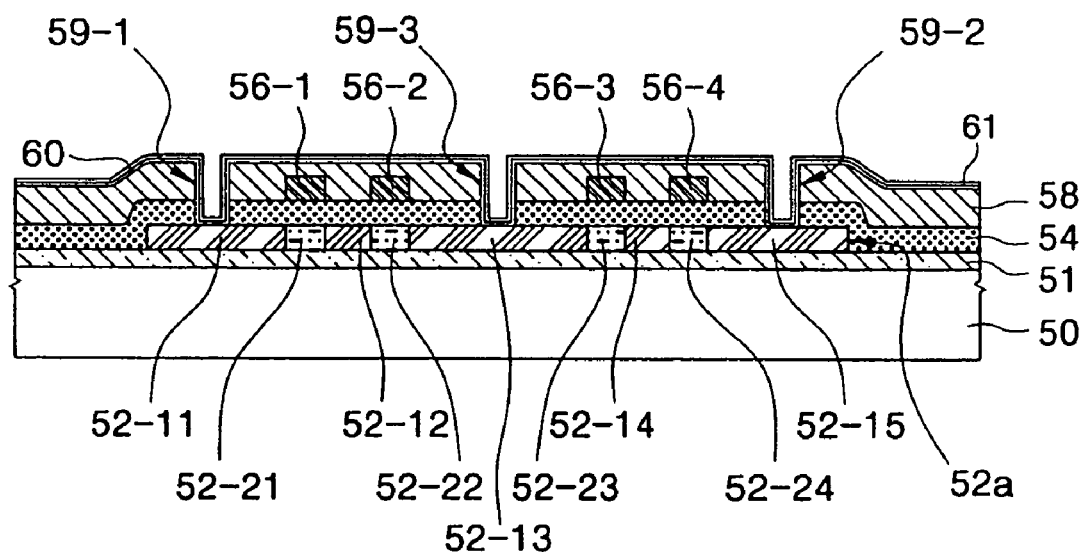
Figure 5C:
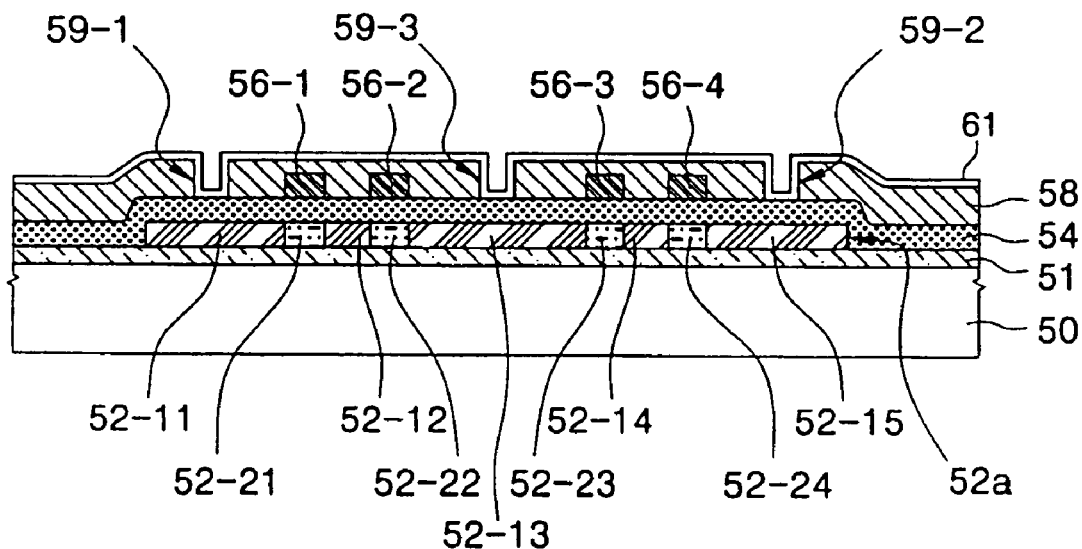
Figure 5D:
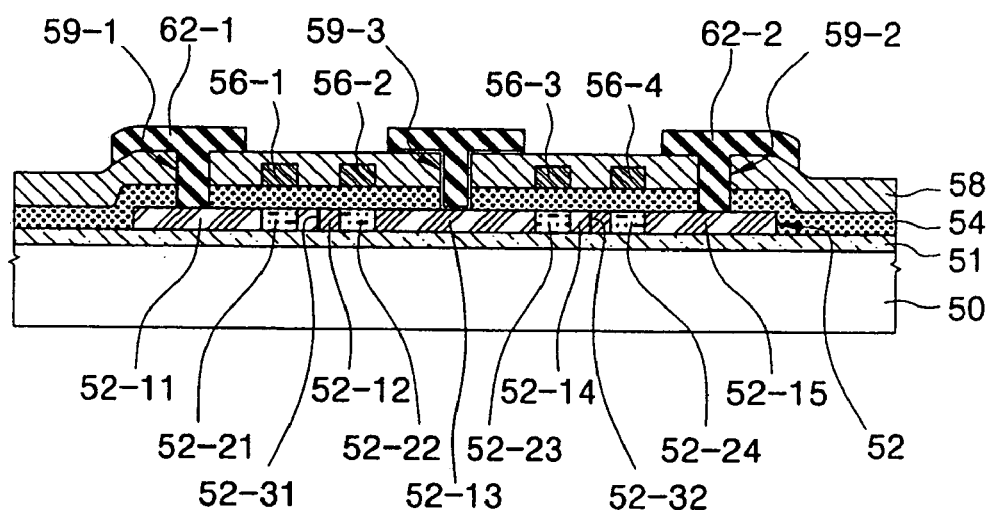
Figure 6A:
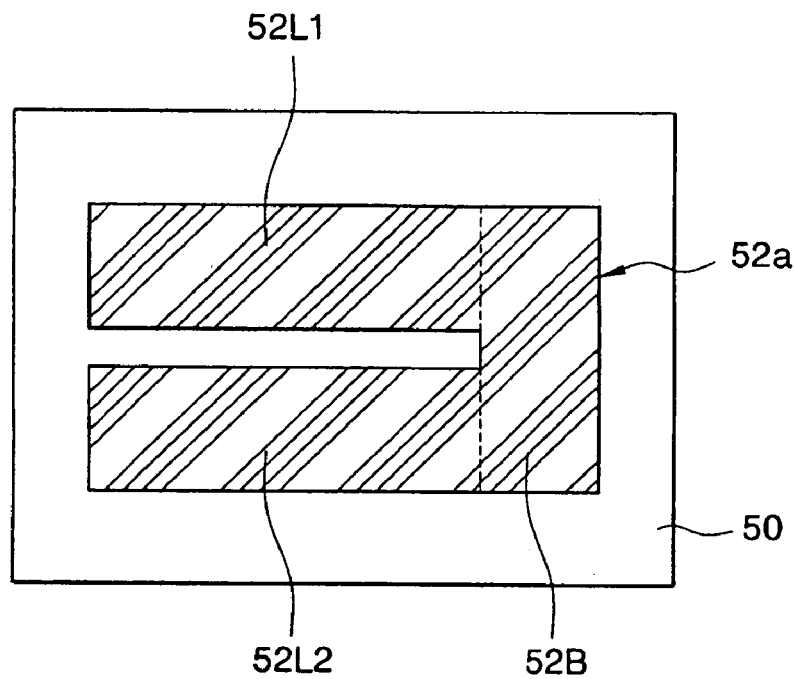
FIG. 6A to FIG. 6D are plan views illustrating a method of fabricating a 4-fold gate TFT using the SGS process according to the embodiment of FIGS. 5A to 5D.
Figure 6B:
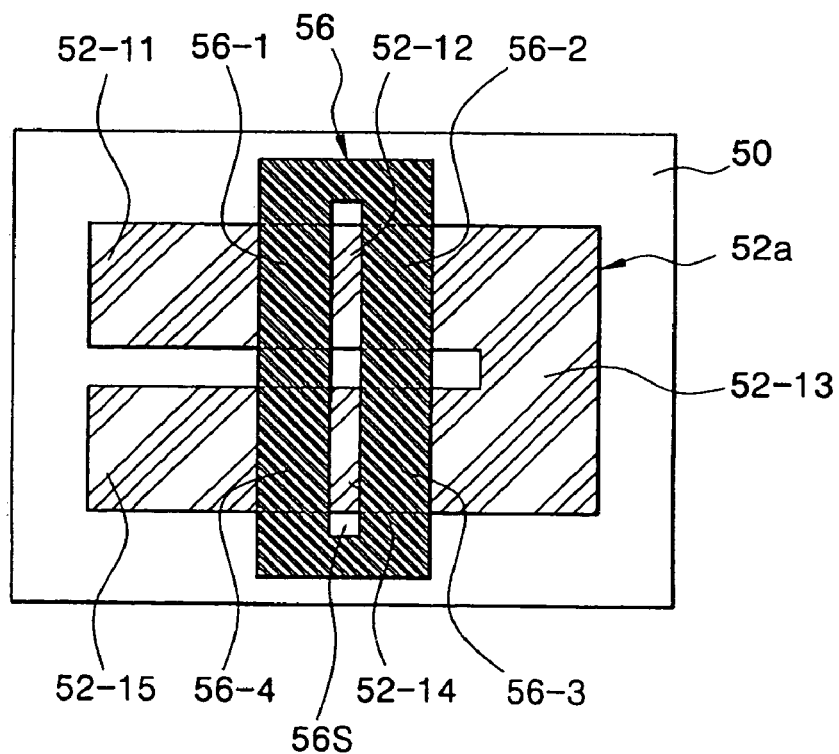
Figure 6C:
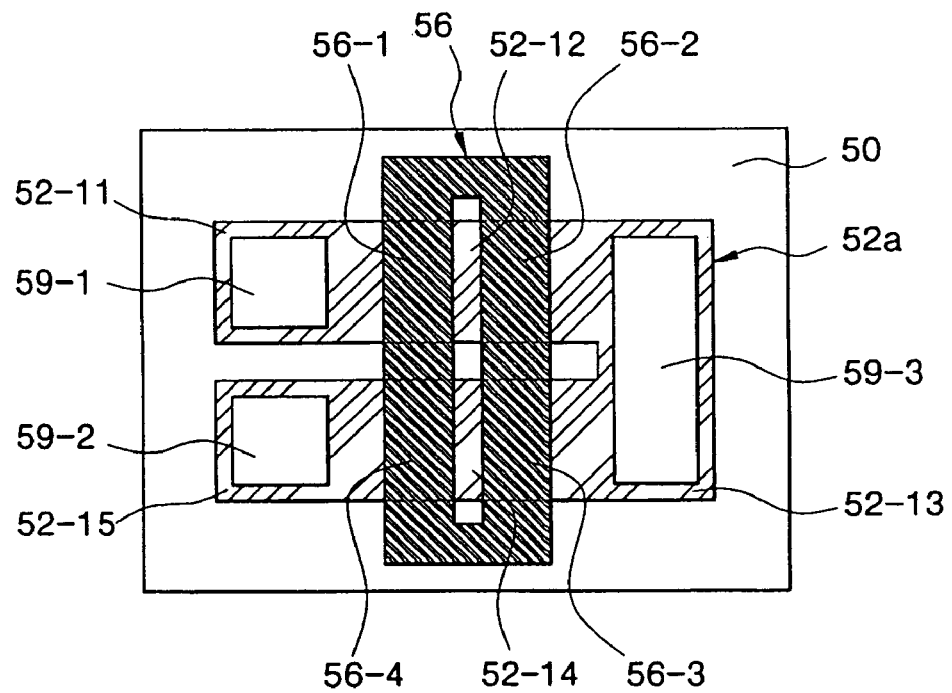
Figure 6D:
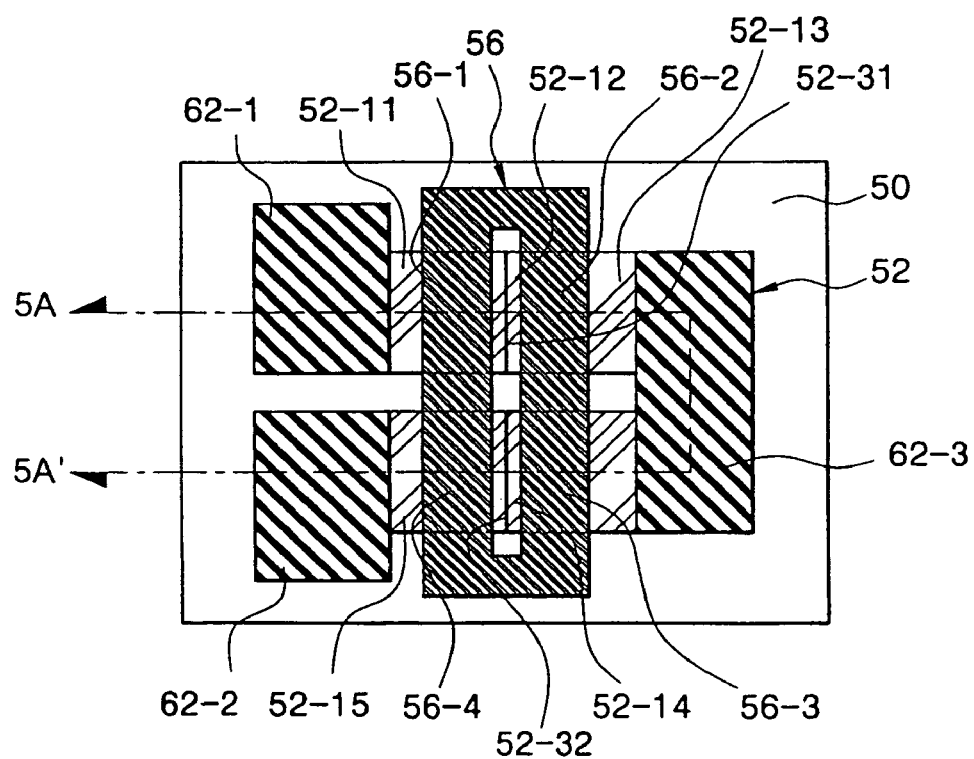

FIG. 5A to FIG. 5D are sectional views illustrating a method of fabricating a TFT with 4-fold gates using a SGS process according to another embodiment of the present invention, and FIG. 6A to FIG. 6D illustrate plan views of a method of fabricating a TFT with 4-fold gates using the SGS process according to the embodiment of FIGS. 5A to 5D, wherein the process sectional views of FIG. 5A to FIG. 5D illustrate the cross-sectional structure according to line 5A-5A' of FIG. 6D.

Referring to FIG. 5A and FIG. 6A, a buffer layer 51 is formed on an insulating substrate 50 such as a glass substrate, and an amorphous silicon film is deposited on the buffer layer 51. A semiconductor layer 52a comprising an amorphous silicon film is formed by patterning the amorphous silicon film using a first mask (which is not shown in the drawings). The semiconductor layer 52a comprising an amorphous silicon film has a "⊏" shaped structure equipped with body parts 52L1 and 52L2 and a connection part 52B to connect the body parts 52L1 and 52L2.

Although a "⊏" shaped structure is illustrated in FIG. 6A in which the semiconductor layer 52a is equipped with a pair of body parts 52L1 and 52L2 and a connection part 52B to connect the body parts 52L1 and 52L2, the semiconductor layer 52a is not limited to the body parts 52L1 and 52L2 and the connection part 52B, but can be equipped with a plurality of body parts 52L, wherein the plurality of body parts 52L are connected by a plurality of connection parts 52B so that the semiconductor layer 52a has a zigzag shaped structure similar to the semiconductor layer 12a equipped with a plurality of body parts 12L shown in FIG. 10.

Referring to FIG. 5B and FIG. 6B, a gate electrode material is deposited on a gate insulating film 54 after forming a gate insulating film 54 on a buffer layer 51 including the semiconductor layer 52a comprising an amorphous silicon film. A gate electrode 56 is formed by patterning the gate electrode material using a second mask (which is not shown in the drawings).

The gate electrode 56 is formed so that it intersects with body parts 52L1 and 52L2 of the semiconductor layer 52a, wherein the gate electrode 56 is equipped with one slot 56S crossing the body parts 52L1 and 52L2, thus equipped with 4-fold gates. That is, in the gate electrode 56, parts 56-1 and 56-2 overlapping a first body part 52L1 out of the body parts 52L1 and 52L2 act as first and second gates, and parts 56-3 and 56-4 overlapping a second body part 52L2 out of the body parts 52L1 and 52L2 act as third and fourth gates.

Impurity areas 52-11 through 52-15 for source/drain regions are formed by ion-planting impurities, for example, N-type or P-type impurities into a semiconductor layer 52a comprising an amorphous silicon film after forming the gate electrode 56.

In the semiconductor layer 52a comprising an amorphous silicon film, a part of the lower part of the first gate 56-1, namely, a part between impurity areas 52-11 and 52-12 for source/drain regions acts as a first channel region 52-21, and a part of the lower part of the second gate 56-2, namely, a part between impurity areas 52-12 and 52-13 for source/drain regions acts as a second channel region 52-22.

Furthermore, in the semiconductor layer 52a comprising an amorphous silicon film, a part of the lower part of the third gate 56-3, namely, a part between impurity areas 52-13 and 52-14 for source/drain regions acts as a third channel region 52-23, and a part of the lower part of the fourth gate 56-4, namely, a part between impurity areas 52-14 and 52-15 for source/drain regions acts as a fourth channel region 52-24.

On the other hand, the gate electrode 56 may have parts acting as more than four gates since parts of the gate electrode 56 equipped with the slot 56S overlapping the body parts 52L would each act as a gate where the semiconductor layer 52a is not formed in a "⊏" shape as shown in FIG. 6A, but is formed in a zigzag shape equipped with a plurality of body parts 52L similar to the semiconductor layer 12a equipped with a plurality of body parts 12L shown in FIG. 10. The example shown in FIG. 10 has five body parts 12L, such that if the semiconductor layer 52a were equipper with five body parts 52L, the gate electrode 56 equipped with the slot 56S would have ten parts overlapping the five body parts 52L and acting as ten gates.

Referring to FIG. 5C and FIG. 6C, an interlayer insulating film 58 is formed on a gate insulating film 54 comprising the gate electrode 56, and contact holes 59-1 through 59-3 are formed so that the impurity areas 52-11, 52-13 and 52-15 for source/drain regions are exposed by etching the interlayer insulating film 58 and the gate insulating film 54 using a third mask (which is not shown in the drawings).

Subsequently, referring to FIG. 5C, a capping layer 60 and a metal film 61 each having a thickness of several angstroms Å to hundreds of angstroms Å are formed on the interlayer insulating film 54 and portions of the impurity areas 52-11, 52-13, and 52-15 in the semiconductor layer 52a comprising the amorphous silicon film that are exposed by the contact holes 59-1 through 59-3. The capping layer 60 is formed so that the capping layer 60 directly contacts the exposed impurity areas 52-1 1 and 52-15 through the first and second contact holes 59-1 and 59-2, and directly contacts the exposed impurity area 52-13 through the third contact hole 59-3.

The capping layer 60 controls a concentration of metal diffused from the metal film 61 into the impurity areas 52-11, 52-13, and 52-15 in the semiconductor layer 52a comprising the amorphous silicon film. The capping layer 60 is made of SiO2 or SiNx, and is preferably made of SiO2. The metal film 61 is made of a metal such as Ni or Pd. Metal from the metal film 36 is diffused into the impurity areas 52-11, 52-13, and 52-15 in the semiconductor layer 52a comprising the amorphous silicon film to form crystallization seeds in the impurity areas 52-11, 52-13, and 52-15 in the semiconductor layer 52a comprising the amorphous silicon film.

On the other hand, referring to FIG. 5C', instead of forming the capping layer 60, the gate insulating film 54 remains in the source/drain regions. The remaining gate insulating film 54 in the source/drain regions acts as a capping layer when the SGS process proceeds.

Referring to FIG. 5D and 6D, a semiconductor layer 52 comprising a polycrystalline silicon film is formed by crystallizing the semiconductor layer 52a comprising the amorphous silicon film using the SGS process. A crystallization time is further shortened since crystallization simultaneously proceeds on both sides of the body parts 52L1 and 52L2 during the SGS process, in contrast to the embodiment of FIGS. 1A to 1D which the crystallization proceeds on only one side of the body parts 12L1 and 12L2 during the SGS process. Therefore, a high-angle grain boundary does not exist in the first to fourth channel regions 52-21 through 52-24, but high-angle grain boundaries 52-31 and 52-32 exist in the slot 56S of the gate electrode 56, namely, in the impurity areas 52-12 and 52-14 for the source/drain regions.

A high-angle grain boundary (not shown) which is not in the first to fourth channel regions 52-21 through 52-24 exists in the impurity area 52-13 where the crystallization process proceeds in the same manner as in the embodiment of FIGS. 1A to 1D.

And then, in the case of the configuration in FIG. 5C, the capping layer 60 and the metal film 61 are removed, or in the case of the configuration in FIG. 5C', the metal film 61 and the portions of the gate insulating film 54 in the contact holes 19-1 through 19-3 are removed.

Subsequently, source/drain electrodes 62-1 and 62-2 and a conductive pattern 62-3 contacting the impurity area 52-13 through the contact hole 59-3 are formed by patterning a metal layer for forming the source/drain electrodes 62-1 and 62-2 and the conductive pattern 62-3 using a fourth mask (which is not shown in the drawings) after depositing the metal layer for forming the source/drain electrodes 62-1 and 62-2 and the conductive pattern 62-3.

Figure 7:
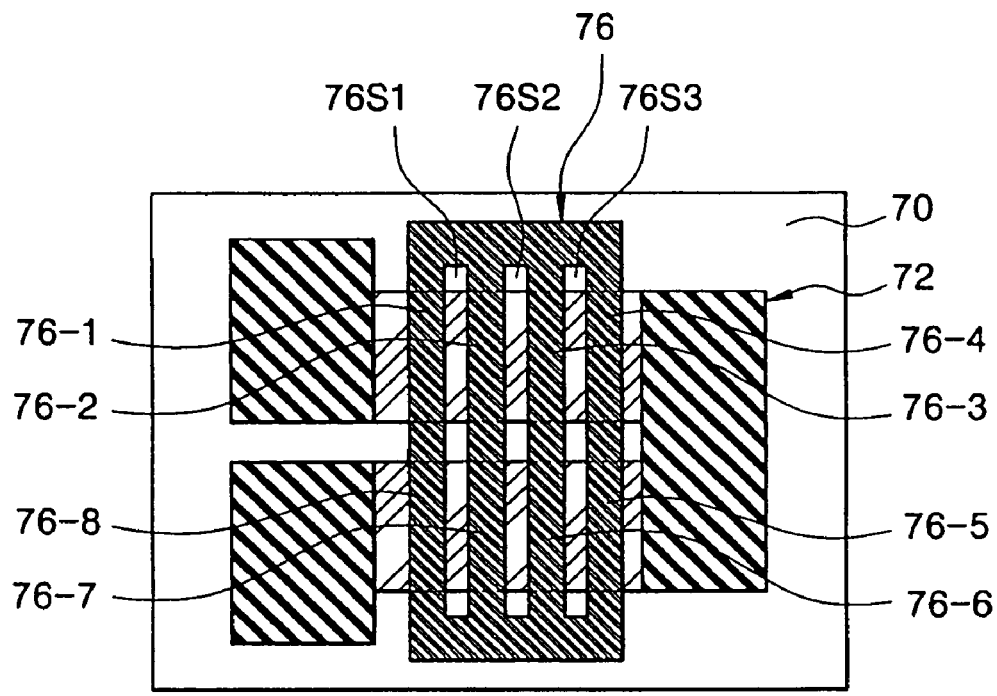
FIG. 7 is a drawing illustrating a structure of the multiple gates in a TFT with multiple gates using the SGS process according to yet another embodiment of the present invention.

FIG. 7 illustrates the plan structure of a thin film transistor with multiple gates according to another embodiment of the present invention.

Referring to FIG. 7, a gate electrode 76 has a plurality of slots, for example, three slots 76S1 through 76S3, which are formed so as to intersect with two body parts of a semiconductor layer 72 supported by an insulating substrate 70 and connected together by a connection part of the semiconductor layer 72 to divide the gate electrode 76 into four parts that form eight gates 76-1 through 76-8 where the four parts of the gate electrode 76 intersect with the two body parts of the semiconductor layer 72. The semiconductor layer 76 may also have a zigzag shape with a plurality of body parts and a plurality of connection parts each of which connects together two neighboring body parts similar to the semiconductor layer 12a shown in FIG. 10.

A thin film transistor according to this embodiment can be fabricated by the same method as in the previous embodiments. A case in which the SGS process proceeds in one direction only as in FIGS. 1A to 1D and 2A to 2D is not affected by the number of slots in the gate electrode since a high-angle grain boundary is formed only in a connection part connecting together two body parts, such as the high-angle grain boundary 12-3 in the connection part 12B shown in FIGS. 1D and 2D.

However, it is preferable to form slots at the central part of the body in which a high-angle grain boundary is to exist since the high-angle grain boundary exists in the body part where the SGS process is progressed in both directions as in FIGS. 5A to 5D, and it is particularly preferable that the number of slots is an odd number so that the high-angle grain boundary does not exist in channel regions, but rather in a semiconductor layer in the slots. The reason that the high-angle grain boundary does not exist in the channel regions, but in the semiconductor layer in the slots positioned at the center is that the number of slots is an odd number while the high-angle grain boundary does exist in the channel regions in the semiconductor layer in case that the number of the slots is an even number.

A separate masking process to form a metal film for the SGS process and a process to remove the metal film remaining after the SGS process are excluded so that the process of forming a TFT with multiple gates is simplified, and a high-angle grain boundary does not exist in the channel regions so as to prevent generation of defects and reduce leakage current in methods of fabricating a thin film transistor with multiple gates according to the embodiments of FIGS. 1A to 1D, FIGS. 5A to 5D, and FIG. 7. Furthermore, thin film transistors with multiple gates are fabricated by forming zigzag shaped semiconductor layers and gate electrodes so that the zigzag shaped semiconductor layers intersect with the gate electrodes, thereby reducing leakage current without increasing dimensions.

Furthermore, multiple gates having the number of M (number of body parts of a semiconductor layer)×N (number of slots of a gate electrode+1) are realized by forming the semiconductor layer in a zigzag shape and forming a gate electrode equipped with one or more slots crossing the semiconductor layer in the methods of fabricating a thin film transistor with multiple gates according to the embodiments of FIGS. 1A to 1D, FIGS. 5A to 5D and FIG. 7 of the present invention.

Figure 8A:
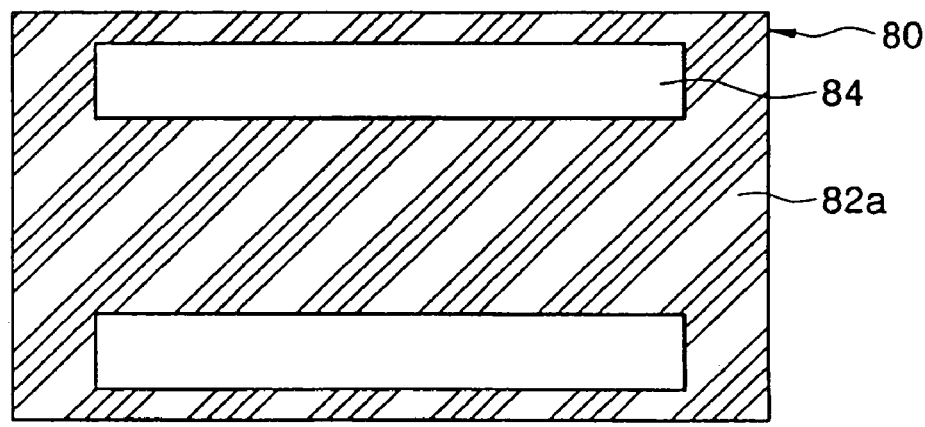
FIG. 8A to FIG. 8C are plan views illustrating a method of fabricating a TFT with multiple gates using a SGS process according to yet another embodiment of the present invention.
Figure 8B:
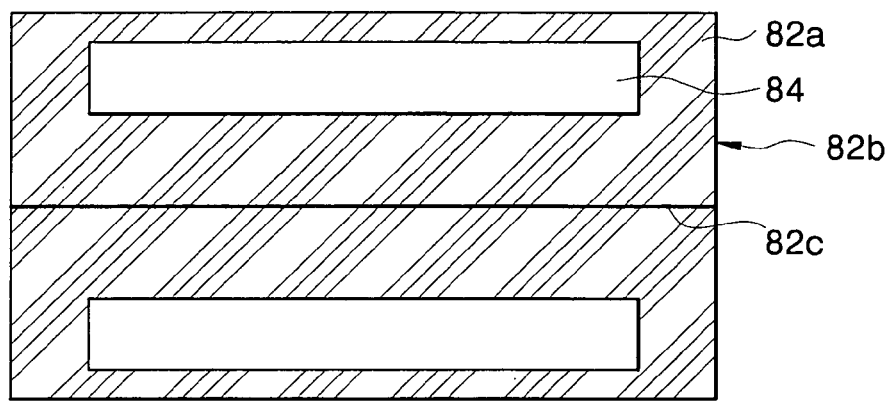
Figure 8C:
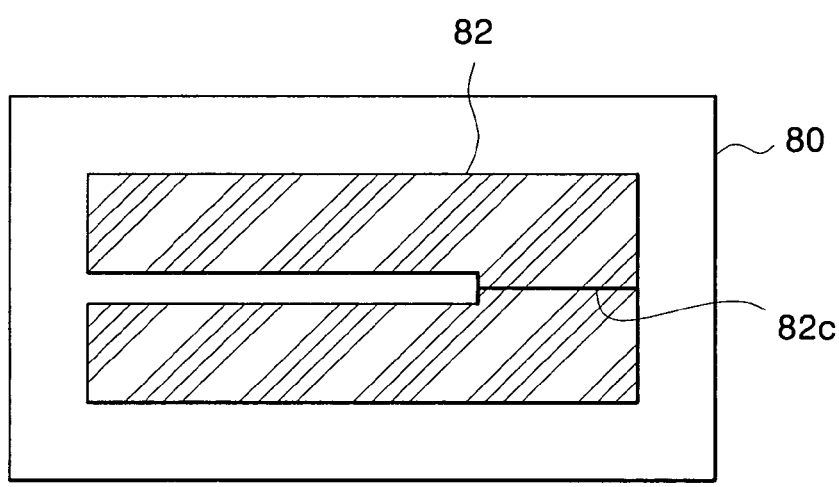

FIG. 8A to FIG. 8C are plan views illustrating a method of fabricating a TFT with multiple gates using the SGS process according to another embodiment of the present invention.

A semiconductor layer is formed by patterning the polycrystalline silicon film after crystallizing an amorphous silicon film into a polycrystalline silicon film using an SGS process in a method of fabricating a thin film transistor with multiple gates according to the embodiment of FIGS. 8A to 8C.

That is, an amorphous silicon film 82a is crystallized into a polycrystalline silicon film 82b by depositing the amorphous silicon film 82a on an insulating substrate 80 comprising a buffer layer (not shown), forming a capping layer (not shown) as a diffusion controlling layer and a metal film 84 as a catalyst layer of the SGS process at both edge parts of the amorphous silicon film 82*a* as illustrated in FIG. 8A, and performing the SGS process to crystallize the amorphous silicon film 82*a* into the polycrystalline silicon film 82*b* as illustrated in FIG. 8B.

Subsequently, a "⊏" shaped semiconductor layer 82 is formed by patterning the polycrystalline silicon film 82*b* using a mask after removing the capping layer and the metal film 84, as illustrated in FIG. 8C. This embodiment can be applied to a thin film transistor having the same structure as in the embodiment of FIGS. 1A to 1D so that a high-angle grain boundary 82*c* exists outside channel regions. Thereafter, a thin film transistor with multiple gates is fabricated by the same method as in the embodiment of FIGS. 1A to 1D.

Figure 9A:
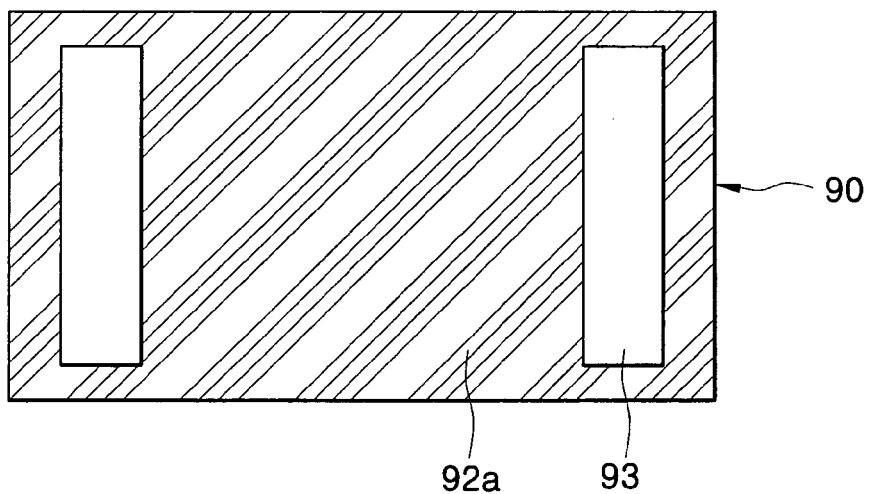
FIG. 9A to FIG. 9C are plan views illustrating a method of fabricating a TFT with multiple gates using a SGS process according to yet another embodiment of the present invention.
Figure 9B:
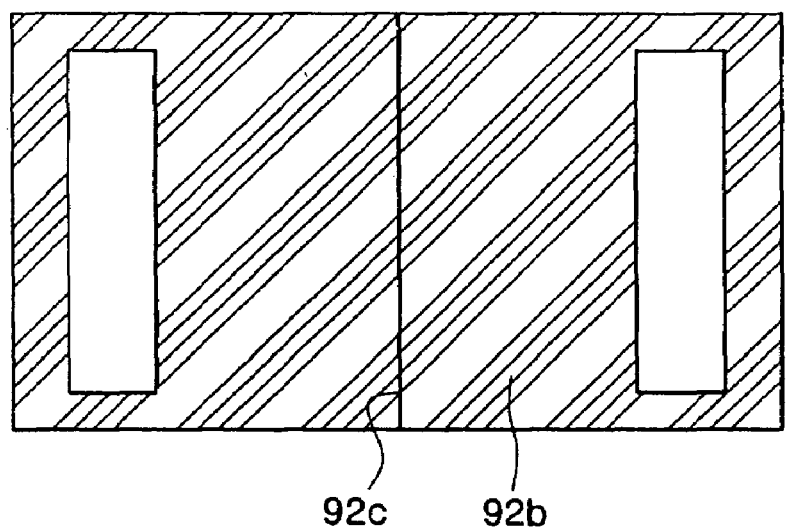
Figure 9C:
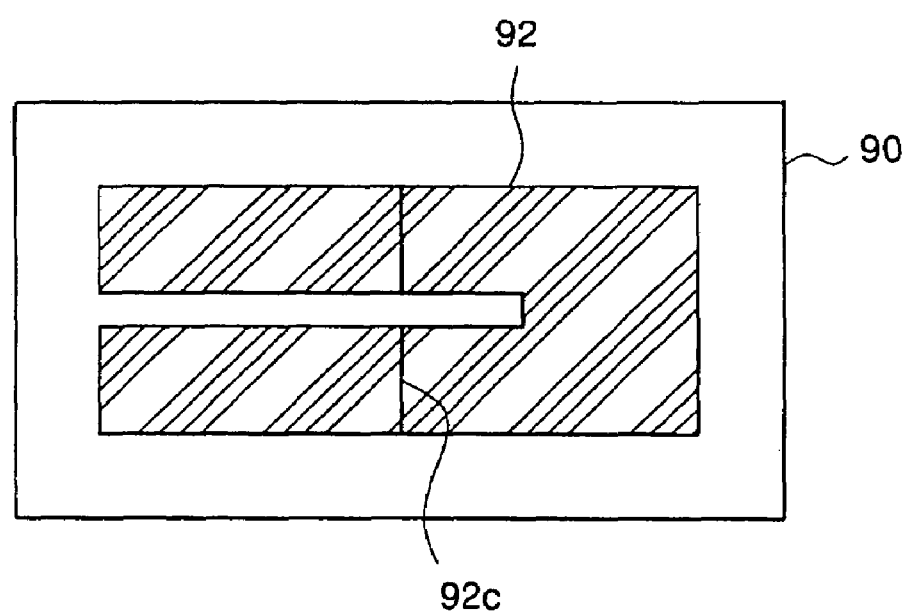

FIG. 9A to FIG. 9C are plan views illustrating a method of fabricating a TFT with multiple gates using a SGS process according to another embodiment of the present invention.

In this embodiment, a semiconductor layer is formed by patterning the polycrystalline silicon film after crystallizing an amorphous silicon film into a polycrystalline silicon film using the SGS process as in the embodiment of FIGS. 8A to 8C.

That is, an amorphous silicon film 92*a* is crystallized into a polycrystalline silicon film 92*b* by depositing the amorphous silicon film 92*a* on an insulating substrate 90, forming a capping layer (not shown) as a diffusion controlling layer and a metal film 93 as a catalyst layer of the SGS process at both edge parts of the amorphous silicon layer 92*a* as illustrated in FIG. 9A, and performing the SGS process to crystallize the amorphous silicon layer 92*a* into the polycrystalline silicon film 92*b* as illustrated in FIG. 9B.

Subsequently, a "⊏" shaped semiconductor layer 92 is formed by patterning the polycrystalline silicon film 92*b* using a mask after removing the capping layer and the metal film 93 as illustrated in FIG. 9C. This embodiment can be applied to a thin film transistor having the same structure as in the embodiment of FIG. 7 so that a high-angle grain boundary 92*c* exists outside channel regions during formation of multiple gates. Thereafter, a thin film transistor with multiple gates is fabricated by the same method as in the embodiment of FIG. 7.

As described above, a method of fabricating a thin film transistor with multiple gates using the SGS process has merits in that a separate masking process of forming a capping layer and a metal film for the SGS process and a process of removing the capping layer and the metal film after the SGS process are excluded so as to simplify the process of fabricating the thin film transistor with multiple gates, and a high-angle grain boundary does not exist in channel regions so as to reduce leakage current.

The thin film transistors according to the embodiments of the present invention have merits in that multiple gates having the number of M (number of body parts of a semiconductor layer)×N (number slots of a gate electrode+ 1) are realized without increasing dimensions by forming the semiconductor layer in a zigzag shape and forming a gate electrode equipped with one or more slots crossing the semiconductor layer.

Furthermore, the present invention not only reduces leakage current and manufacturing cost but also shortens process time by forming a thin film transistor with multiple gates using the SGS process without an additional masking process.

Furthermore, the present invention enables compact designs since dimensions are not increased by forming a semiconductor layer in a zigzag shape and forming a plurality of slots on gate electrodes so that the slots intersect with the semiconductor layer, thereby forming a thin film transistor with multiple gates. Therefore, the present invention has merits in that leakage current is suppressed, and reliability is improved with an opening ratio not being influenced to a large extent.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A thin film transistor comprising:
a semiconductor layer formed in a zigzag shape on an insulating substrate; and
a gate electrode intersecting with the semiconductor layer;
wherein the semiconductor layer has a high-angle grain boundary in a portion of the semiconductor layer that does not cross the gate electrode.

2. The thin film transistor of claim 1, wherein the semiconductor layer comprises:
two or more body parts intersecting with the gate electrode; and
one or more connection parts each connecting together two neighboring ones of the body parts;
wherein portions of the body parts intersecting with the gate electrode act as channel regions; and
wherein portions of the gate electrode overlapping the channel regions act as multiple gates.

3. The thin film transistor of claim 2, wherein the high-angle grain boundary is in one of the one or more connection parts.

4. The thin film transistor of claim 1, wherein the gate electrode comprises one or more slots intersecting with the semiconductor layer.

5. The thin film transistor of claim 4, wherein the high-angle grain boundary is in a portion of the semiconductor layer overlapped by one of the one or more slots of the gate electrode.

6. The thin film transistor of claim 1, wherein the semiconductor layer is formed in a ⊏ shape on the insulating substrate.

7. The thin film transistor of claim 1, wherein the semiconductor layer is formed in a ⊨ shape on the insulating substrate.

8. A thin film transistor comprising:
a multi-semiconductor layer formed on an insulating substrate; and
a gate electrode intersecting with the multi-semiconductor layer;
wherein a high-angle grain boundary does not exist in the multi-semiconductor layer.

9. The thin film transistor of claim 8, wherein the multi-semiconductor layer comprises two or more semiconductor layers intersecting with the gate electrode;
wherein the thin film transistor further comprises one or more links each connecting together two neighboring ones of the semiconductor layers;
wherein portions of the semiconductor layers intersecting with the gate electrode act as channel regions; and
wherein portions of the gate electrode overlapping the channel regions act as multiple gates.

10. The thin film transistor of claim of claim 8, wherein the gate electrode comprises one or more slots intersecting with the multi-semiconductor layer.

11. The thin film transistor of claim 9, wherein the one or more links are in one layer of the thin film transistor, and the semiconductor layers are in another, different layer of the thin film transistor.

12. A thin film transistor comprising:
a multi-semiconductor layer formed on an insulating substrate; and
a gate electrode intersecting with the multi-semiconductor layer;
wherein portions of the multi-semiconductor layer intersecting with the gate electrode act as channel regions; and
wherein a high-angle grain boundary does not exist in the channel regions.

13. The thin film transistor of claim 12, wherein the multi-semiconductor layer comprises two or more semiconductor layers intersecting with the gate electrode;
wherein the thin film transistor further comprises one or more links each connecting together two neighboring ones of the semiconductor layers;
wherein portions of the semiconductor layers intersecting with the gate electrode act as the channel regions; and
wherein portions of the gate electrode overlapping the channel regions act as multiple gates.

14. The thin film transistor of claim 13, further comprising source/drain electrodes contacting portions of the multi-semiconductor layer outside the channel regions.

15. The thin film transistor of claim of claim 12, wherein the gate electrode comprises one or more slots intersecting with the multi-semiconductor layer.

16. The thin film transistor of claim 13, wherein the one or more links are in one layer of the thin film transistor, and the semiconductor layers are in another, different layer of the thin film transistor.

17. The thin film transistor of claim 16, wherein the one or more links are made of a same material as the gate electrode.

18. The thin film transistor of claim 16, wherein a high-angle grain boundary does not exist in the multi-semiconductor layer.

19. A thin film transistor comprising:
a semiconductor layer formed in a rectangular shape having one side open on an insulating substrate, or formed in a zigzag shape on the insulating substrate; and
a gate electrode comprising at least one slot crossing the semiconductor layer;
wherein the semiconductor layer has a high-angle grain boundary in a portion of the semiconductor layer overlapped by one of the at least one slot of the gate electrode;
wherein the semiconductor layer comprises:
two or more body parts intersecting with the gate electrode; and
one or more connection parts each connecting together two neighboring ones of the body parts;
wherein portions of the body parts intersecting with the gate electrode act as channel regions; and
wherein portions of the gate electrode overlapping the channel regions act as multiple gates.

20. The thin film transistor of claim 1, wherein the semiconductor layer does not have a high-angle grain boundary in any portion of the semiconductor layer that crosses the gate electrode.

21. The thin film transistor of claim 8, wherein the multi-semiconductor layer comprises two or more semiconductor layers separated from one another on the insulating substrate.

22. The thin film transistor of claim 12, wherein the multi-semiconductor layer comprises two or more semiconductor layers separated from one another on the insulating substrate.

23. The thin film transistor of claim 12, wherein a high-angle grain boundary does not exist in the multi-semiconductor layer.

24. The thin film transistor of claim 14, wherein the one or more links is made of a same material as the source/drain electrodes.

* * * * *